(12) United States Patent
Hirano et al.

(10) Patent No.: US 6,787,884 B2
(45) Date of Patent: Sep. 7, 2004

(54) CIRCUIT COMPONENT, CIRCUIT COMPONENT PACKAGE, CIRCUIT COMPONENT BUILT-IN MODULE, CIRCUIT COMPONENT PACKAGE PRODUCTION AND CIRCUIT COMPONENT BUILT-IN MODULE PRODUCTION

(75) Inventors: Koichi Hirano, Hirakata (JP); Seiichi Nakatani, Hirakata (JP); Hiroyuki Handa, Hirakata (JP); Tsunenori Yoshida, Yawata (JP); Yoshihisa Yamashita, Kyoto (JP); Hiroyuki Ishitomi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/448,921

(22) Filed: May 29, 2003

(65) Prior Publication Data

US 2003/0222335 A1 Dec. 4, 2003

(30) Foreign Application Priority Data

May 30, 2002 (JP) ........................................ 2002-158088

(51) Int. Cl.$^7$ .............................................. H01L 23/04
(52) U.S. Cl. ...................... 257/618; 257/730; 257/700; 257/705; 257/773
(58) Field of Search ................................ 257/618, 693, 257/783, 620, 720, 700, 705, 730, 733

(56) References Cited

U.S. PATENT DOCUMENTS

| | | | | |
|---|---|---|---|---|
| 4,574,297 A | * | 3/1986 | Ooi | 257/696 |
| 6,354,485 B1 | * | 3/2002 | Distefano | 228/179.1 |
| 6,580,152 B2 | * | 6/2003 | Hasegawa | 257/618 |
| 6,583,512 B2 | * | 6/2003 | Nakaoka et al. | 257/777 |
| 6,603,190 B2 | * | 8/2003 | Kosaki et al. | 257/618 |
| 6,605,869 B2 | * | 8/2003 | Kimura | 257/723 |

FOREIGN PATENT DOCUMENTS

| | | | |
|---|---|---|---|
| JP | 58-27314 | 2/1983 | |
| JP | 3-2 U | 5/1989 | |
| JP | 6-29102 | 2/1994 | |
| JP | 6-151687 | * 5/1994 | ......... 257/664 |
| JP | 8-241827 | 9/1996 | |
| JP | 10-97942 | 4/1998 | |
| JP | 11-220262 | 8/1999 | |

* cited by examiner

Primary Examiner—Jasmine Clark
(74) Attorney, Agent, or Firm—Merchant & Gould P.C.

(57) ABSTRACT

A circuit component package of the present invention includes a mounting member including a substrate and a wiring pattern provided on the substrate, a circuit component including a component body and an external electrode provided at an end of the component body, the circuit component being arranged on the mounting member, and a conductive material that electrically connects the external electrode with the wiring pattern. In the circuit component, the component body is shaped so that a first portion of the component body on which the external electrode is provided is thinner than a second portion of the component body, the second portion being a portion on which the external electrode is not provided, and further, the external electrode is arranged in a region on a side on which the component body is positioned with respect to a reference plane containing a predetermined surface of the component body. The circuit component is arranged on the mounting member so that the component body is in contact with the mounting member. The predetermined surface of the component body is a surface of the component body that is to be opposed to the mounting member when the circuit component is mounted on the mounting member.

38 Claims, 13 Drawing Sheets

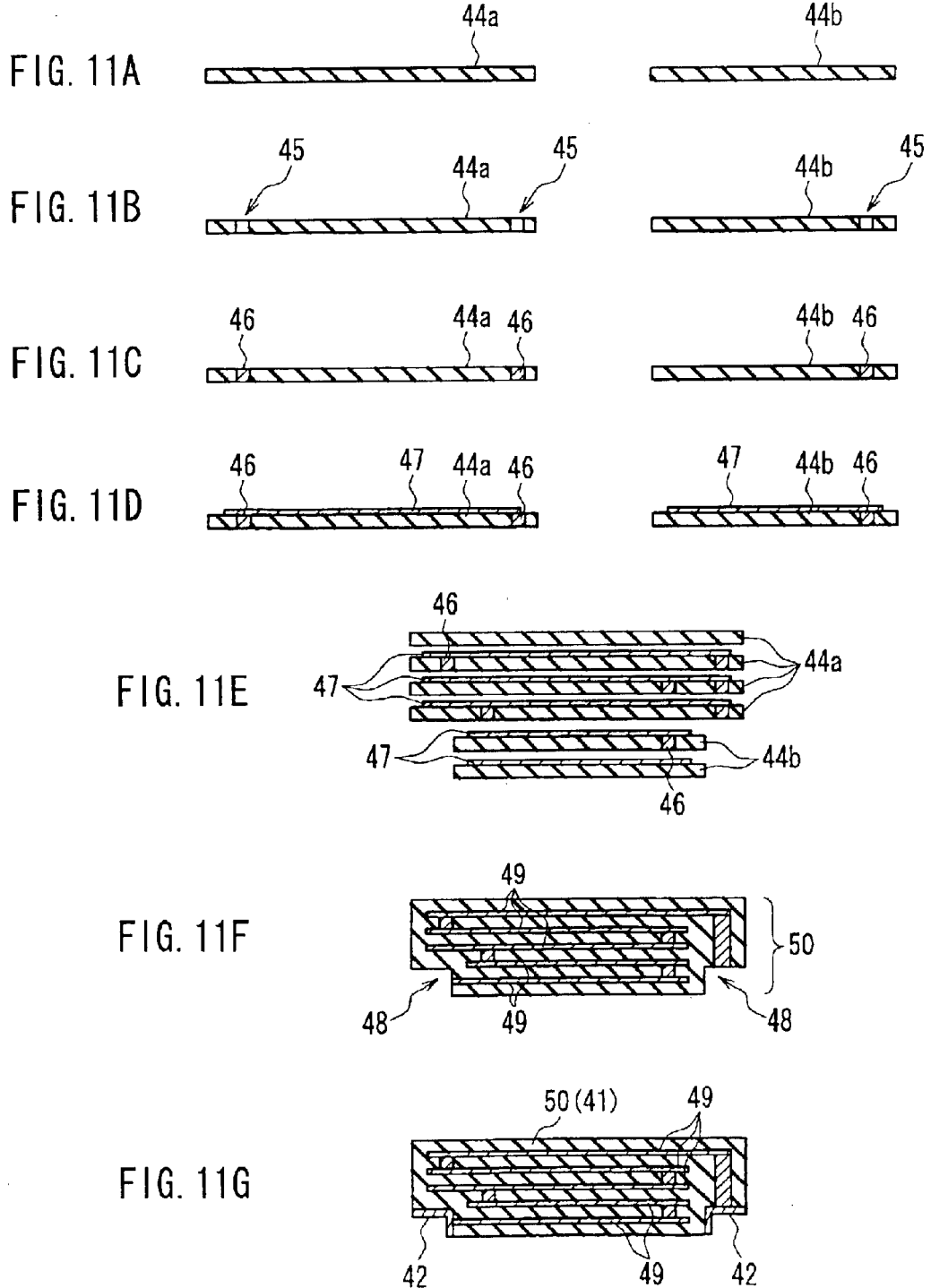

CIRCUIT COMPONENT, CIRCUIT COMPONENT PACKAGE, CIRCUIT COMPONENT BUILT-IN MODULE, CIRCUIT COMPONENT PACKAGE PRODUCTION AND CIRCUIT COMPONENT BUILT-IN MODULE PRODUCTION

BACKGROUND OF THE INVENTION

1. Field of the Invention

The present invention relates to a surface-mountable circuit component suitably used in a portable information terminal, etc. that is required to have a small-size, high-density, and high-efficiency profile, a circuit component package, and a circuit component built-in module, as well as to methods for producing the circuit component package and the circuit component built-in module.

2. Related Background Art

Recently, with the reduction of size and the increase of the packaging density of electric and electronic apparatuses, a technique of providing a plurality of components as one package for each functional block in forming a module has been used often, as compared with the conventional technique of forming electric circuits by mounting individual component on a board. The module thus formed is formed usually by mounting necessary components on one side or both sides of a daughter board. However, with the method of mounting individual components on a surface of a board, it is impossible to make the module area smaller than the area of components mounted, and hence, there is a limit on the further increase in the packaging density. Further, in the case of this method, since the components are arranged planarly, connection distances between components necessarily increase according to the configurations of components arranged. This increases the resistance loss and causes a problem regarding the impedance match with respect to high frequencies.

Therefore, a configuration of a module in which components are arranged three-dimensionally has been proposed, in which components are not only mounted two-dimensionally on a surface of a board but also within the board. As a method for producing such a module, there are, for instance, a method of providing a gap in a ceramic substrate and arranging a component in the gap portion, and a method of providing a gap portion in a multi-layer printed circuit board and arranging a component in the gap portion.

However, in the case of the method of providing a gap in a ceramic substrate and arranging a component in the gap portion, it is impossible to incorporate a circuit component containing semiconductor or an organic substance in the substrate since the method involves a sintering process. Therefore, it is impossible to mount a component at a position above the portion where the gap is provided and the circuit component is arranged. This enables a low profile structure, but the three-dimensional arrangement of components is not applicable thereto actually. Therefore, there is a limit on the further increase of the packaging density by this method. Furthermore, in the case where a ceramic substrate is used, since the connection between layers is carried out through vias that are obtained by sintering a high-resistance metal such as tungsten and molybdenum, the connection resistance is relatively high. This is a significant problem as to power supply circuits that are adversely affected by losses.

On the other hand, in the case of the method of providing a gap in a multi-layer printed circuit board and arranging a component in the gap portion, the connection between layers with low resistances is enabled by through hole connection, but has difficulty with heat radiation since the printed circuit board has a low heat conductivity, thereby not allowing heat generated from the component arranged in the board to be transferred to the outside. Therefore, in an actual design, the temperature rise has to be taken into consideration, and this makes it impossible to arrange components at a higher density. Still further, the printed circuit board has a thermal expansion coefficient of approximately 60 ppm/° C. in the thickness direction, which significantly differs from a thermal expansion coefficient of copper as a material of plating (17 ppm/° C.). Therefore, there is also a problem in connection reliability.

JP 11-220262A discloses a circuit component built-in module with which high packaging density and high reliability can be achieved by solving the foregoing problems. The circuit component built-in module incorporates at least one active component and/or passive component in an electric insulation substrate made of a mixture containing at least an inorganic filler and a thermosetting resin, the inorganic filler being 70 percent by weight (wt %) to 95 wt %, and a plurality of wiring patterns arranged therein are connected electrically through inner vias made of a conductive resin composition. This circuit component built-in module makes it possible to arrange components at a higher density by the three-dimensional component arrangement, and provides a higher reliability due to the matching between thermal expansion coefficients.

A circuit component used in such a circuit component built-in module is a surface-mountable type principally. This is because it is important to arrange the components at a high density with respect to the board. When such surface-mountable components are mounted on a board, the components normally are mounted on wiring patterns arranged on the board, and electrode portions of the components and the wiring patterns are connected electrically using a solder or a conductive adhesive. FIG. 18 illustrates a state in which a surface mountable component 101 is mounted on a board 104 on which a wiring pattern 105 is provided. The circuit component 101 is composed of a component body 102, and external electrodes 103 provided at ends of the component body 102.

However, in the case where a normal surface-mountable circuit component is used, the external electrode portions at the ends thereof have a thickness slightly greater than a thickness of the component body. This is because when the external electrodes are formed, a metal paste or the like is applied on surfaces of the component body and sintered, and thereafter, plating films are formed further thereon, whereby the portions necessarily become thick. Therefore, as shown in FIG. 18, when the component is mounted on the substrate 104 on which the wiring pattern 105 is provided, a gap 106 is formed between the component body 102 of the circuit component 101 and a mounting member composed of the board 104 and the wiring pattern 105. The presence of the gap 106 causes a problem when the circuit component 101 is embedded in an electric insulation material so that a circuit component built-in module is produced, as the circuit component 101 cracks due to pressure applied thereto upon being embedded.

Further, in the process of embedding the circuit component connected with the wiring pattern in the electric insulation material, heating has to be carried out so as to cure the electric insulation material after the embedding. Therefore, in the case where the circuit component is connected with the wiring pattern with use of a low-melting metal such as a solder, when the temperature reaches the melting point of the low-melting metal in the heating process, the low-melting metal flows into the gap between the circuit component and the wiring pattern, thereby making a short-circuit.

SUMMARY OF THE INVENTION

A circuit component of the present invention includes a component body, and an external electrode provided at an end of the component body, in which the component body is shaped so that a first portion of the component body on which the external electrode is provided is thinner than a second portion of the component body, the second portion being a portion on which the external electrode is not provided. A thickness of the first portion at a position where the first portion is thinnest is not more than 90% of a thickness of the second portion, and the external electrode is arranged in a region on a side on which the component body is positioned with respect to a reference plane containing a predetermined surface of the component body. The predetermined surface of the component body is a surface of the component body that is to be opposed to a mounting member when the circuit component is mounted on the mounting member.

A circuit component package of the present invention includes a mounting member including a substrate and a wiring pattern provided on the substrate, a circuit component including a component body and an external electrode provided at an end of the component body, the circuit component being arranged on the mounting member, and a conductive material that electrically connects the external electrode with the wiring pattern. In the circuit component package, the circuit component is configured so that the component body is shaped so that a first portion of the component body on which the external electrode is provided is thinner than a second portion of the component body, the second portion being a portion on which the external electrode is not provided, and that the external electrode is arranged in a region on a side on which the component body is positioned with respect to a reference plane containing a predetermined surface of the component body. The predetermined surface of the component body is a surface of the component body that is to be opposed to the mounting member when the circuit component is mounted on the mounting member. Further, in the circuit component package, the circuit component is arranged on the mounting member so that the component body is in contact with the mounting member.

A circuit component built-in module of the present invention includes a circuit component including a component body and an external electrode provided at an end of the component body, a first wiring pattern electrically connected with the external electrode of the circuit component, a conductive material electrically connecting the external electrode with the first wiring pattern, and an electric insulation member incorporating the circuit component. In the circuit component built-in module, the circuit component is configured so that the component body is shaped so that a first portion of the component body on which the external electrode is thinner than a second portion of the component body, the second portion is a portion on which the external electrode is not provided, and the external electrode is arranged in a region on a side on which the component body is positioned with respect to a reference plane that contains a predetermined surface of the component body. The predetermined surface of the component body being a surface of the component body that is to be opposed to a mounting member when the circuit component is mounted on the mounting member.

A method for producing a circuit component package of the present invention includes a first step of preparing a circuit component that includes a component body and an external electrode provided at an end of the component body. The component body is shaped so that a first portion of the component body on which the external electrode is provided is thinner than a second portion of the component body, the second portion being a portion on which the external electrode is not provided, and the external electrode is arranged in a region on a side on which the component body is positioned with respect to a reference plane containing a predetermined surface of the component body. The predetermined surface of the component body being a surface of the component body that is to be opposed to a mounting member when the circuit component is mounted on the mounting member. The foregoing method further includes a second step of arranging the circuit component in a predetermined region on the mounting member that is formed by providing a wiring pattern on a substrate, and arranging a conductive material between the external electrode and the wiring pattern, so as to integrate the circuit component with the mounting member in a manner such that the component body is in contact with the mounting member.

A first method for producing a circuit component built-in module of the present invention includes: a first step of processing a mixture containing an inorganic filler and a thermosetting resin into a sheet form having through holes so as to obtain a sheet-like member having through holes; a second step of filling a conductive material in the through holes; a third step of preparing a circuit component package including a circuit component, stacking the sheet-like member and a metal foil in the stated order on the circuit component package, and applying heat and pressure to the obtained stack, so as to embed the circuit component in the sheet-like member; and a fourth step of processing the metal foil so as to form a wiring pattern. Here, the circuit component package includes: a mounting member including a substrate and a wiring pattern provided on the substrate; the circuit component including a component body and an external electrode provided at an end of the component body, the circuit component being arranged on the mounting member; and a conductive material that electrically connects the external electrode with the wiring pattern. In the circuit component, the component body is shaped so that a first portion of the component body on which the external electrode is provided is thinner than a second portion of the component body, the second portion being a portion on which the external electrode is not provided, and the external electrode is arranged in a region on a side on which the component body is positioned with respect to a reference plane containing a predetermined surface of the component body. The predetermined surface of the component body is a surface of the component body that is to be opposed to a mounting member when the circuit component is mounted on the mounting member. Further, the circuit component is arranged on the mounting member so that the component body is in contact with the mounting member.

A second method for producing a circuit component built-in module of the present invention includes: a first step of processing a mixture containing an inorganic filler and a thermosetting resin into a sheet form having through holes so as to obtain obtaining a sheet-like member having through holes; a second step of filling a conductive material in the through holes; and a third step of preparing at least two circuit component packages including circuit components, preparing a stack by interposing the sheet-like member between the circuit component packages, and applying heat and pressure to the stack, so as to embed the circuit components in the sheet-like member. Here, each of the circuit component packages includes: a mounting member including a substrate and a wiring pattern provided on the substrate; the circuit component including a component body and an external electrode provided at an end of the component body, the circuit component being arranged on the mounting member; and a conductive material that electrically connects the external electrode with the wiring pattern. In the circuit component, the component body is shaped so that a first portion of the component body on which the external electrode is provided is thinner than a second portion of the component body, the second portion being a portion on which the external electrode is not provided, and the external electrode is arranged in a region on a side on which the component body is positioned with respect to a reference plane containing a predetermined surface of the component body. The predetermined surface of the component body is a surface of the component body that is to be opposed to the mounting member when the circuit component is mounted on the mounting member. Further, the circuit component is arranged on the mounting member so that the component body is in contact with the mounting member.

BRIEF DESCRIPTION OF THE DRAWINGS

FIGS. 11A to 11G are cross-sectional views illustrating respective steps of a method for producing the circuit component shown in FIGS. 9A and 9B.

DETAILED DESCRIPTION OF THE INVENTION

Figure 1A:
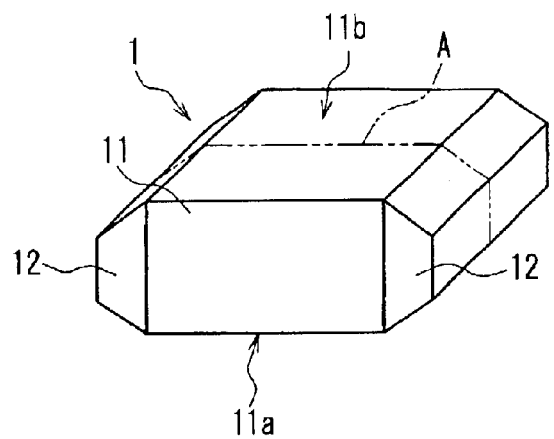
FIG. 1A is a perspective view illustrating an embodiment of a circuit component of the present invention.

With the configuration of the circuit component of the present invention, a gap hardly is formed between the component body and the mounting member when the component is mounted on the mounting member. Therefore, the circuit component resists breakage upon application of pressure in a state in which the component is mounted on the mounting member. Further, even in the case where the circuit component is mounted on the mounting member using a low-melting metal, the low-melting metal hardly flows into between the component body and the mounting member, and hence, short-circuitingis reduced. Therefore, the use of such a circuit component makes it possible to provide a circuit component built-in module with a high packaging density and a high reliability. Further, since in the component body, the portion with the external electrode has a thickness, where it is minimum, of not more than 90% of the thickness of the other portion, it is possible to prevent the external electrode from increasing the thickness of the circuit component. Further, in the case where the circuit component is mounted on a mounting member on which a wiring pattern protrudes from the surface of the mounting member, an enhanced position accuracy can be achieved in mounting the component.

In the circuit component of the present invention, a surface of the external electrode that is opposed to the reference plane preferably is tilted at a tilt angle of not less than 10° and not more than 50° with respect to the reference plane. This eliminates the necessity for designing the wiring pattern so that when the component is mounted on the mounting member, the external electrodes should not be in contact with the wiring pattern provided on the mounting member and make the component body unfixed on the mounting member. Therefore, this increases the freedom in designing the wiring pattern on the mounting member and the freedom in mounting the component.

In the circuit component of the present invention, a distance from the reference plane to a surface of the external electrode that is opposed to the reference plane at a position where the surface and the reference plane are separated farthest preferably is not less than 30 μm and not more than 100 μm. The setting of the distance to not less than 30 μm allows a further sufficient gap to be formed between the external electrode and the mounting member when the circuit component is mounted on the mounting member, thereby further increasing the freedom in designing the wiring pattern on the mounting member and the freedom in mounting the component. The setting of the distance to not more than 100 μm prevents an increase in the resistance of the connection between the external electrodes and the mounting member, and prevents the connection reliability from deteriorating.

In the circuit component of present invention, the external electrode preferably is arranged so as not to cross the reference plane. This enhances the close contact between the component body and the mounting member when the circuit component is mounted on the mounting member, thereby preventing a conductive material from flowing between the component body and the mounting member and from making a short circuit between the same and the external electrodes. It should be noted that the conductive member is intended to connect electrically the external electrodes of the circuit component with the mounting member.

The circuit component of the present invention preferably is a surface-mountable chip component. The configuration in which the circuit component is the surface-mountable chip component enables high-density packaging, which leads to the size reduction of a circuit component built-in module. The surface-mountable chip component preferably is at least one selected from the group consisting of a resistor, a capacitor, and an inductor.

Next, the circuit component package of the present invention is described below.

With the configuration of the circuit component package of the present invention, a gap hardly is formed between the component body and the mounting member. Therefore, the circuit component resists breaking upon application of a pressure. Further, even in the case where the conductive material for electrically connecting the external electrodes of the circuit component with the wiring pattern is a low-melting metal, the low-melting metal hardly flows into between the component body and the mounting member, and hence, short-circuiting hardly occurs. Therefore, the use of such a circuit component package makes it possible to provide a circuit component built-in module with a high packaging density and a high reliability. It should be noted that though the circuit component is arranged on the mounting member so that the component body and the mounting member are brought into contact with each other, it preferably is arranged thereon so that they are in contact with each other at least in an area corresponding to a center portion of the component body.

In the circuit component package of the present invention, the wiring pattern preferably does not protrude from a surface of the substrate. By forming the wiring pattern so as not to protrude from the surface of the substrate, it is possible to eliminate the necessity of designing the wiring pattern for preventing the component body of the circuit component from being unfixed from the surface of the substrate. Therefore, the freedom in the wiring pattern design and the freedom in the circuit component mounting are enhanced.

In the circuit component package of the present invention, a circuit board containing an electric insulation material or a carrier film can be used as the substrate. Further, the circuit board used herein may have a multilayer wiring structure in which wiring patterns are arranged in a plurality of layers in the electric insulation material.

In the circuit component package of the present invention, the conductive material preferably is a conductive resin composition containing a solder, or a combination of a metal powder and a thermosetting resin. The solder preferably contains, as a principal component thereof, at least one kind of metal selected from the group consisting of Pb, Cu, Zn, Sn, Ag, and In. These metals are low-melting metals, which can be provided for connection at a relatively low temperature. Therefore, in the case where a resin is used in the mounting member or the circuit component, etc., thermal damages to the resin can be reduced. The metal powder preferably contains at least one kind of metal selected from the group consisting of Au, Ag, Cu, Ni, Pd, and Pt. This is because these metals have low resistances, and are stable.

In the circuit component package of the present invention, in the component body, the thickness of the first portion at a position where the first portion is thinnest preferably is not more than 90% of a thickness of the second portion. This suppresses an increase in the thickness of the circuit component due to the external electrodes, thereby suppressing an increase in the thickness of the circuit component package.

In the circuit component package of the present invention, the a surface of the external electrode that is opposed to the reference plane preferably is tilted at a tilt angle of not less than 10° and not more than 50° with respect to the reference plane. This eliminates the necessity for designing the wiring pattern so that that the external electrodes should not be in contact with the wiring pattern and make the component body unfixed on the mounting member. Therefore, this increases the freedom in designing the wiring pattern and the freedom in mounting the component.

In the circuit component package of the present invention, a distance from the reference plane to a surface of the external electrode of the circuit component that is opposed to the reference plane, at a position where the surface and the reference plane are separated farthest, preferably is not less than 30 μm and not more than 100 μm. This allows a further sufficient gap to be formed between the external electrode and the mounting member, thereby further increasing the freedom in designing the wiring pattern and the freedom in mounting the component. This also prevents an increase in the resistance of the connection between the external electrodes and the mounting member and deterioration of the connection reliability from occurring due to the gap provided.

In the circuit component package of the present invention, the circuit component preferably is a surface-mountable chip component. The configuration in which the circuit component is the surface-mountable chip component enables high-density packaging, which leads to the size reduction of a circuit component built-in module. The surface-mountable chip component preferably is at least one selected from the group consisting of a resistor, a capacitor, and an inductor In the circuit component package of the present invention, the external electrode of the circuit component preferably is arranged so as not to cross the reference plane. This enhances the close contact between the component body and the mounting member, thereby preventing a conductive material from flowing between the component body and the mounting member and from making a short circuit between the external electrodes.

In the circuit component package of the present invention, the conductive material does not protrude into a region on the mounting member side with respect to the reference plane, the mounting member side being a side on which the mounting member is positioned. This configuration is intended to enhance the close contact between the component body and the mounting member.

By a method of the present invention for producing a circuit component package, it is possible to produce the circuit component package of the present invention as described above.

Next, the circuit component built-in module of the present invention is described below.

With the circuit component built-in module of the present invention, it is possible to provide a circuit component built-in module with a high packaging density and a high reliability.

In the circuit component built-in module of the present invention, the electric insulation member contains an inorganic filler and a thermosetting resin. This is intended to enhance the heat radiation and makes it possible to arrange circuit components at a high density.

The circuit component built-in module of the present invention preferably further includes a second wiring pattern that is provided in or on the electric insulation member and that is connected electrically with the first wiring pattern. Further, in the module, it is preferable that a plurality of the second wiring patterns are provided, and that the first wiring pattern is connected electrically with at least one of the plurality of the second wiring patterns through an inner via provided in the electric insulation member.

In the circuit component built-in module of the present invention, the first wiring pattern preferably is provided on a substrate, and does not protrude from a surface of the substrate. Further, as the substrate, a circuit board containing an electric insulation material may be used. Still further, the circuit board may be configured so as to have a multilayer wiring structure in which a plurality of the first wiring patterns are arranged in a plurality of layers in the electric insulation material.

In the circuit component built-in module of the present invention, the conductive material preferably is a conductive resin composition containing a solder, or a combination of a metal powder and a thermosetting resin. The solder preferably contains, as a principal component thereof, at least one kind of metal selected from the group consisting of Pb, Cu, Zn, Sn, Ag, and In. The metal powder preferably contains at least one kind of metal selected from the group consisting of Au, Ag, Cu, Ni, Pd, and Pt.

In the circuit component built-in module of the present invention, in the component body, a thickness of the first portion at a position where the first portion is thinnest preferably is not more than 90% of a thickness of the second portion.

In the circuit component built-in module of the present invention, a surface of the external electrode of the circuit component that is opposed to the reference plane preferably is tilted at a tilt angle of not less than 10° and not more than 50° with respect to the reference plane.

In the circuit component built-in module of the present invention, a distance from the reference plane to a surface of the external electrode of the circuit component that is opposed to the reference plane at a position where the surface and the reference plane are separated farthest preferably is not less than 30 μm and not more than 100 μm.

In the circuit component built-in module of the present invention, the external electrode of the circuit component preferably is arranged so as not to cross the reference plane.

In the circuit component built-in module of the present invention, the circuit component preferably is a surface-mountable chip component. The chip component preferably is at least one selected from the group consisting of a resistor, a capacitor, and an inductor.

In the circuit component built-in module of the present invention, the conductive material preferably does not protrude into a region on a mounting member side with respect to the reference plane, the mounting member side being a side on which the mounting member is positioned.

As described above, by using a circuit component or circuit component package that has the same configuration as that of the present invention in the circuit component built-in module of the present invention, it is possible to achieve a circuit component built-in module with a higher packaging density and a higher reliability.

By the first or second method of the present invention for producing a circuit component built-in module, it is possible to produce a circuit component built-in module of the present invention as described above. Further, in the first and second methods of the present invention for producing a circuit component built-in module, in the case where the substrate in the circuit component package used in the third step is a carrier film, the method preferably further includes a step of removing only the carrier film from the stack after the third step, so as to transfer the wiring pattern provided on the carrier film onto the sheet-like member. By this method, it is possible to achieve a circuit component built-in module thinner in thickness and smaller in volume.

Hereinafter, embodiments of the present invention will be described, with reference to the drawings.

Embodiment 1

The following will describe an embodiment of a circuit component according to the present invention.

Figure 1B:
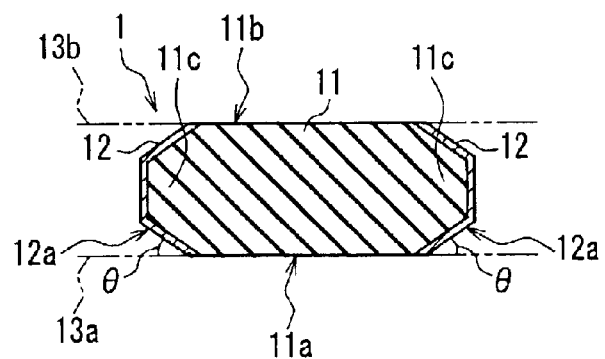
FIG. 1B is a cross-sectional view of the circuit component shown in FIG. 1A taken along a chain double-dashed line A.

FIG. 1A is a perspective view illustrating a circuit component 1 according to the present embodiment, and FIG. 1B is a cross-sectional view of the circuit component 1 shown in FIG. 1A taken along a chain double-dashed line A.

The circuit component 1 includes a component body 11, and external electrodes 12 arranged at ends (first portions) of both sides of the component body 11. In FIGS. 1A and 1B, a lower surface of the component body 11 is a mount surface 11a, which is a predetermined surface of the component body 11, and as shown in FIG. 1B, a mount reference plane 13a is determined according to the mount surface 11a. It should be noted that the mount surface 11a is a surface of the component body 11 that is opposed to a mounting member (not shown in FIGS. 1A and 1B) when the circuit component 1 is mounted on the mounting member, and the mount reference plane 13a is a plane including the mount surface 11a of the component body 11. For convenience, herein, a side on which the component body 11 is positioned with respect to the mount reference plane 13a is referred to as an upper side, and a side opposite to the foregoing side, that is, a side on which the mounting member is positioned when the circuit component 1 is mounted on the mounting member, is referred to as a lower side.

In the circuit component 1, the external electrodes 12 are arranged on surfaces at both ends of the component body 11, and in an upper region with respect to the mount reference plane 13a. In the component body 11, portions 11c on which the external electrodes 12 are arranged are formed thinner as compared with the other portion (center portion, second portion) so that, in each of them, its thickness decreases continuously with increasing proximity to the end. This shape eliminates the possibility that when the component is mounted on the mounting member, the external electrodes are in contact with a wiring pattern provided on the mounting member and make the component body unfixed on the mounting member. Consequently it provides an effect of increasing the freedom in designing the wiring pattern on the mounting member and the freedom in mounting the component. A surface 12a of the external electrode 12 that is opposed to the mount reference plane 13 (hereinafter referred to as lower surface 12a) is tilted at a tilt angle θ with respect to the mount reference plane 13a. The tilt angle θ may be set so that when the circuit component 1 is mounted on the mounting member, a sufficient gap is formed between the lower surface 12a of the external electrode 12 and the mounting member, and the tilt angle θ preferably is not less than 10°. Further, the tilt angle preferably is set to be not more than 50°, since with this, an external electrode portion sufficient for connection is secured in a small-size circuit component, and the gap between the mounting member and the circuit component does not become excessively wide. Still further, the distance between the lower surface 12a of the external electrode 12 and the mount reference plane 13a preferably is not less than 30 μm at a position where the lower surface 12a and the mount reference plane 13a are separated farthest, and the external electrode 12 is arranged so as to not cross the mount reference plane 13a.

Figure 2:
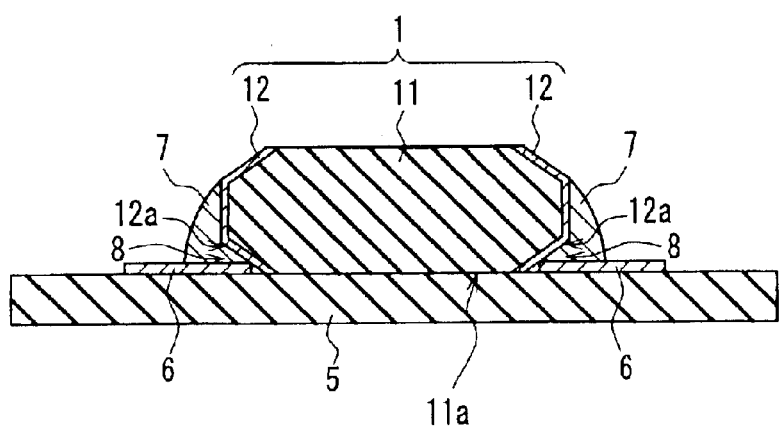
FIG. 2 is a cross-sectional view illustrating an embodiment of a circuit component package of the present invention.

FIG. 2 is a cross-sectional view illustrating a circuit component package obtained by mounting the circuit component 1 on a mounting member. The mounting member is a circuit board (substrate) 5 containing an electric insulation material on which a wiring pattern 6 is arranged. In the present embodiment, the wiring pattern 6 is arranged on the circuit board 5, and the wiring pattern 6 and the external electrodes 12 of the circuit component 1 are connected electrically via a conductive material 7. Though the mount surface 11a of the component body 11 of the circuit component 1 is in contact with the circuit board 5, a gap 8 is provided between the lower surface 12a of each external electrode 12 and the wiring pattern 6 provided on the circuit board 5, since the external electrode 12 of the circuit component 1 is arranged in the upper region with respect to the mount reference plane 13a, as shown in FIG. 1B. Further, the external electrodes 12 are formed on a lower side with respect to a height reference plane 13b that is determined according to an upper surface 11b of the component body 11. Therefore, an increase of the component thickness due to the external elements 12 can be suppressed. Further, since the conductive material 7 does not protrude from of the mount surface 11a of the component body 11 on a mounting member side, no gap is formed between the circuit board 5 and the component body 11. It should be noted that though an entirety of the mount surface 11a of the component body 11 is in contact with the circuit board 5 in the present embodiment, the entirety of the surface need not be in contact, but preferably a certain area of the mount surface 11a between the external electrodes 12 arranged on both ends (an area extending, in FIG. 2, in a direction perpendicular to the surface of the sheet carrying FIG. 2 thereon) is in contact with the circuit board 5.

The circuit board 5 is not limited particularly, and a generally used printed wiring board, ceramic substrate, or the like is used as the circuit board 5. However, in the case where a circuit component built-in module having the circuit component 1 embedded in an electric insulation member is produced, it is preferable to use a circuit board made of the same material as that of the electric insulation member used. This eliminates a thermal expansion difference between the electric insulation member incorporating the circuit component 1 and the circuit board 5. Consequently, it is possible to produce a circuit component build-in module with high reliability, by using the circuit component package obtained by mounting the circuit component 1 on the circuit board 5.

A conductive resin composition containing a solder, or a metal powder and a thermosetting resin, can be used as the conductive material 7. The solder preferably contains, as a principal component, at least one kind of metal selected from the group consisting of Pb, Cu, Zn, Sn, Ag, and In. These metals have low melting points, and hence, the connection can be provided at a relatively low temperature. Therefore, in the case where a resin is used in the circuit board 5 or the circuit component 1, the use of such a metal reduces damage to the resin. Further, the metal powder preferably contains at least one kind of metal selected from the group consisting of Au, Ag, Cu, Ni, Pd, and Pt. This is because these metals have low resistances, and are stable.

As described above, with the circuit component 1 formed so that gaps are provided between the external electrodes 12 and the mounting member when it is mounted, it is possible to electrically connect the circuit component 1 with the wiring pattern 6, with substantially no gap being formed between the component body 11 of the circuit component 1 and the mounting member in a mounted state in which the circuit component 1 is mounted on the mounting member. Therefore, even in the case where the circuit component 1 arranged on the circuit board 5 is embedded in the electric insulation member, it is possible to prevent damage such as cracking of the circuit component 1 or the like caused by a pressure applied when it is embedded. Therefore, by providing the circuit component 1 and the circuit component package that is resistant to a pressure or the like applied thereto after it is mounted, it is possible to provide a high-density and high-reliability circuit component built-in module. Further, since substantially no gap is present between the component body 11 and the circuit substrate 5 in the mounted state, even if the external electrodes 12 and the wiring pattern 6 are connected via a low-melting metal, the low-melting metal molten in a heat treatment hardly flows into between the component body 11 and the mounting member. Therefore, it is possible to prevent the short-circuiting of the wiring. Still further, since the configuration is such that a gap is present between the external electrode 12 and the mounting member, the wiring pattern design makes it unnecessary to take special measures for preventing the circuit component 1 from being unfixed due to the wiring pattern 6 provided on the mounting member, which used to be necessary. Therefore, the freedom in the wiring pattern design and the freedom in the component mounting are enhanced also.

Further, with the circuit component 11 formed so that a gap is provided between the external electrodes 12 and the mounting member when the component is mounted, it is possible to arrange the component body 11 and the mounting member with substantially no gap being formed between the component body 11 of the circuit component 1 and the mounting member in a mounted state in which the circuit component 1 is mounted on the mounting member. Therefore, the positioning precision for mounting the circuit component 1 is improved.

It should be noted that the circuit component 1 of the present embodiment is configured so that, as shown in FIGS. 1A and 1B, on a side opposite to the mount surface side, that is, on the upper surface side, the external electrodes 12 are formed only on surfaces of the thinned portions of component body 11, but the external electrodes may be formed also on a surface of a non-thinned portion of the component body 11 on the upper side.

Further, though a member including the circuit board 5 and the wiring pattern 6 provided on the circuit board 5 is used as the mounting member in the circuit component package in the present embodiment, it is possible to use a mounting member employing a carrier film in place of the circuit board 5 (a mounting member composed of a carrier film and a wiring pattern formed on the carrier film).

Next, the following will describe an embodiment of a method for producing a circuit component according to the present invention. FIGS. 3A to 3E are cross-sectional views illustrating respective steps of the method for producing the circuit component 1.

Figure 3A:
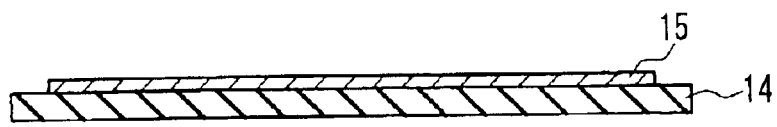
FIGS. 3A to 3E are cross-sectional views illustrating respective steps of a method for producing the circuit component shown in FIGS. 1A and 1B.

As shown in FIG. 3A, a conductive paste 15 containing a metal powder and an organic binder is applied (printed) on a predetermined region on a green sheet 14 that is obtained by forming a mixture containing an inorganic powder and an organic binder in a sheet form.

Figure 3B:
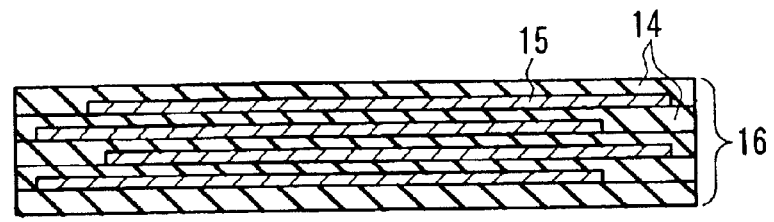

Next, as shown in FIG. 3B, a plurality of the green sheets 14 on which the conductive paste 15 is applied are prepared and stacked on one another. On the topmost layer of the stack thus obtained, another green sheet 14 on which the conductive paste 15 is not printed is stacked, and thereafter, pressure is applied to the stack in a stacking direction, whereby a stack 16 of the green sheets 14 and the conductive paste 15 is produced. It should be noted that the conductive paste 15 is to function as an internal electrode of the circuit component in a finished state.

Figure 3C:
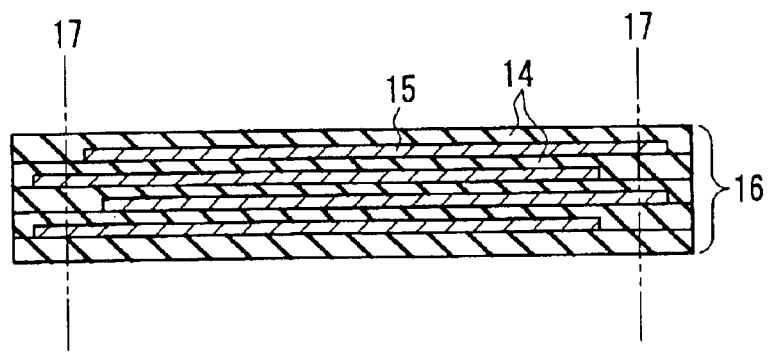

Next, as shown in FIG. 3C, the stack 16 is cut at predetermined cutting positions 17 into a predetermined size.

Figure 3D:
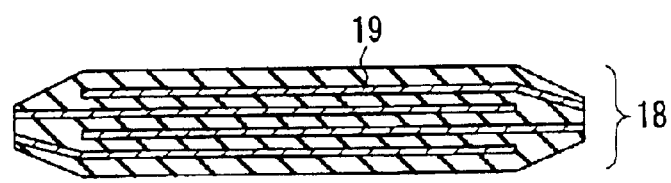

Thereafter, the stack 16 thus formed so as to have the predetermined size is sintered. The stack 16 includes the conductive paste 15, which is applied by printing so that the quantity of the conductive paste 15 provided in both the end portions of the stack 16 is smaller as compared with that in a center portion of the stack 16. The conductive paste 15 has a smaller shrinkage ratio than that of the green sheet 14 upon the sintering. Therefore, due to the difference between the shrinkage ratios thereof upon the sintering, the end portions are thinned as compared with the center portion. These end portions are portions on which the external electrodes are to be formed. In other words, by sintering the stack 16, a sintered ceramic 18 as shown in FIG. 3D is provided, which incorporates an internal electrode 19 having a comb structure and which is shaped so that a thickness of the portions on which external electrodes are formed (end portions) is smaller than a thickness of the center portion. It should be noted that though only a circuit component configured so that both the upper and lower surfaces are inclined due to the sintering is shown here, it also is possible to produce a component configured so that only the lower surface is inclined, by stacking the green sheets 14 so that the size of the green sheet 14 decreases continuously with increasing proximity to the lower surface.

Figure 3E:
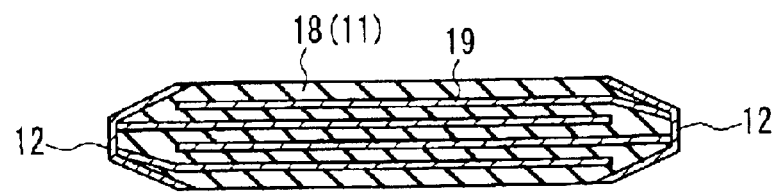

Thereafter, as shown in FIG. 3E, the external electrodes 12 are formed on surfaces of the end portions of the sintered ceramic 18 (corresponding to the component body 11). It should be noted that though the external electrodes 12 are formed over entire surfaces of the end portions of the sintered ceramic 18 in the circuit component 1 of the present embodiment, they may be formed at least partially on the end portions.

Through the foregoing process, the circuit component 1 is produced. Next, the following will describe materials used for producing the circuit component 1.

First of all, an inorganic powder used for forming the green sheet 14 may be determined appropriately according to characteristics that the circuit component is to exhibit in use. For instance, in the case where the stacked ceramic capacitor is produced using the green sheets 14, an inorganic powder with a high dielectric constant, made of $BaTiO_3$, $BaZrO_3$, $CaZrO_3$, $SrTiO_3$, $BaSnO_3$, $CaSnO_3$, $PbTiO_3$, $MgO$, $MgTiO_3$, $NiSnO_3$, $MgZrO_3$, $CaTiO_3$, or the like, can be used alone or in a mixture. Further, in the case where a ceramic substrate is produced using the green sheets 14, an inorganic powder of $Al_2O_3$, $AlN$, $SiC$, $CaO$, $MgO$, $SiO_2$, $Y_2O_3$, or $BaO$ can be used alone or in a mixture so as to be applicable in the high-temperature sintering, whereas a mixture obtained by mixing an inorganic powder of $Al_2O_3$, $MgO$, $ZrO_2$, $TiO_2$, $SiO_2$, $BeO$, $BN$, or $CaO$ with cordierite, mullite, or glass such as boro-silicate glass can be used so as to be applicable in the low-temperature sintering. Still further, in the case where an inductor is produced by using the green sheets 14, NiZn ferrite, NiZnCu ferrite, or the like can be used.

An organic binder for use in the green sheet 14 may be selected appropriately from those generally used. Examples of the organic binder include ethyl cellulose, acetyl cellulose, acrylic resins that are resin-based binders, polyvinyl acetate, polyvinyl acetal, and polyvinyl butyral. Further, a solvent for thinning the mixture, a dispersant, a plasticizer, a release agent, etc. may be added thereto.

The method for producing the green sheet 14 may be selected from the methods usually used for forming a stacked ceramic capacitor, a ceramic substrate, etc. For instance, the method using the doctor blade or the slot die can be used.

Next, examples of a metal powder for use in the conductive paste 15 include, for instance, Pd, Ag—Pd, Ni, Cu, and Ag. Further, as the organic binder for use in the conductive paste 15, materials used in the organic binder for forming the green sheet 14 can be used. Further, a solvent for adjusting the viscosity, a dispersant, a plasticizer, a release agent, etc. may be added thereto.

Upon the stacking of the green sheets 14 as shown in FIG. 3B, drying preferably is carried out preliminarily so as to remove a solvent or the like contained in the conductive paste 15 printed. The temperature and the period of time of the drying may be determined appropriately according to the kind of solvent added.

The temperature and the ambient atmosphere when the stack 16 is sintered so as to form the sintered ceramic may be determined appropriately according to the material of the green sheet 14 and the kind of the conductive paste 15 that is to become the internal electrode 19. Normally, the sintering process is divided into an organic binder removing step and a ceramic sintering step, and the temperature and ambient atmosphere are set optimally in each of the steps. The sintering temperature may be set in a range of 700° C. to 1300° C. The atmosphere may be selected from nitrogen gas, hydrogen gas, hydrocarbon gas, steam, etc. used alone, and mixtures of these.

Furthermore, as described above, the stack 16 containing the conductive paste 15 can be sintered into a shape such that the end portions are thinner than that of the center portion, due to a difference in shrinkage ratios upon the sintering. Here, to achieve a low profile structure, a thickness of the portion (end portion) where the external electrode is arranged, at a position where the portion is thinnest preferably is less than 90% of a thickness of a portion (center portion) on which the foregoing external-electrode is not-arranged.

A metal such as Ag or Cu can be used for forming the external electrode 12. In the present embodiment, the external electrodes 12 are formed by preparing this metal in a paste form beforehand, applying the same on surfaces of the end portions of the sintered ceramic 18 on which the external electrodes are to be formed, and sintering the same again. Alternatively, the external electrodes 12 may be formed by applying the metal paste on the end portions of the stack 16 in the FIG. 3(c) state as the portions on which the external electrodes are to be formed, and sintering the metal paste also when the ceramic is sintered. Further, the external electrodes may be plated with Ni, Sn, Pd, a solder, etc. By applying such plating, the wettability and the oxidation resistance are improved, whereby the mounting characteristics are enhanced.

The circuit component package of the present embodiment shown in FIG. 2 is formed by mounting the circuit component 1 produced as described above on the mounting member. More specifically, a solder paste, for instance, is prepared as the conductive material 7, and is printed on the wiring pattern 6 on the mounting member using a metal mask. Thereafter, the circuit component 1 is soldered on the wiring pattern 6, whereby the circuit component package is produced. In the case where a conductive resin composition containing a metal powder and a thermosetting resin is used as the conductive material 7, it is preferable that the circuit component 1 is mounted on the wiring pattern 6 after the conductive resin composition is printed on the wiring pattern 6 as in the case of the solder paste, and thereafter the conductive resin composition is cured through a heat treatment in a heating oven so that the circuit component 1 is connected with the wiring pattern 6, whereby the circuit component package is produced. During the foregoing heat treatment, a pressure preferably also is applied so as to bring the circuit component 1 in contact with the mounting member.

Embodiment 2

The following will describe another embodiment of a circuit component according to the present invention.

Figure 4A:
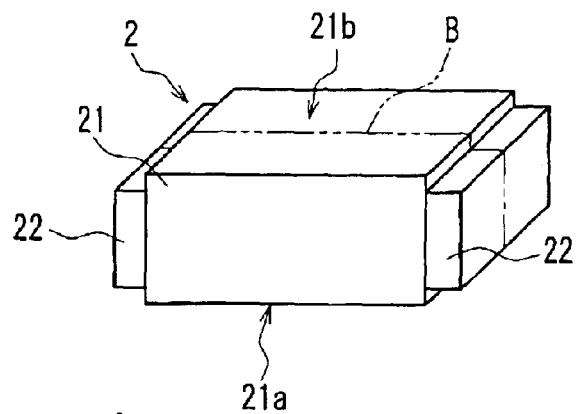
FIG. 4A is a perspective view illustrating another embodiment of a circuit component of the present invention.
Figure 4B:
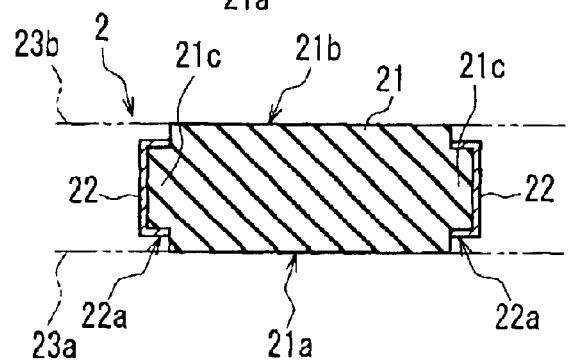
FIG. 4B is a cross-sectional view of the circuit component shown in FIG. 4A taken along a chain double-dashed line B.

FIG. 4A is a perspective view of a circuit component 2 according to the present embodiment, and FIG. 4B is a cross-sectional view of the circuit component 2 shown in FIG. 4A, taken along a double chain dashed line B.

The circuit component 2 includes a component body 21, and external electrodes 22 arranged at ends (first portions) of the component body 21. In FIGS. 4A and 4B, a lower surface of the component body 21 is a mount surface 21a that is a predetermined surface of the component body 21, and as shown in FIG. 4B, a mount reference plane 23a is determined according to the mount surface 21. It should be noted that the mount surface 21a is a surface of the component body 21 that is opposed to a mounting member when the circuit component 2 is mounted on the mounting member, and the mount reference plane 23a is a plane including the mount surface 21a of the component body 21. For convenience, herein, a side on which the component body 21 is positioned with respect to the mount reference plane 23a is referred to as an upper side, and a side opposite to the foregoing side, that is, a side on which the mounting member is positioned when the circuit component 2 is mounted on the mounting member is referred to as a lower side.

In the circuit component 2, external electrodes 22 are arranged on surfaces of the end portions of the component body 21, and in a region on an upper side with respect to the mount reference plane 23a. Each portion 21a on which the external electrode 22 is arranged is formed thinner than the other portion (center portion, second portion). A surface 22a of the external electrode 22 that is opposed to the mount reference plane 23a (hereinafter referred to as a lower surface 22a) has a level difference with respect to the mount surface 21 of the component body 21. In other words, the lower surface 22a of the external electrode 22 is indented from the mount surface 21a of the component body 21. This shape eliminates the possibility that when the component is mounted on the mounting member, the external electrodes are in contact with a wiring pattern provided on the mounting member and cause the component body to be unfixed on the mounting member. Consequently it provides an effect of increasing the freedom in designing the wiring pattern on the mounting member and the freedom in mounting the component. A distance between the lower surface 22a of the electrode 22 and the mount reference plane 23a may be set so that a gap is formed between the lower surface 22a of the external electrode 22 and the mounting member when the circuit component 2 is mounted on the mounting member, and preferably is set to be not less than 30 $\mu$m. Further, the distance between the lower surface 22a of the external electrode 22 and the mount reference plane 23a preferably is set to be not more than 100 $\mu$m, since in the case where the gap is too large, a distance of connection between the external electrodes and a component-side surface of the mounting member increases, which tends to cause an increase in a resistance or deterioration of reliability. Further, since the external electrode 22 is formed on a lower side with respect to a height reference plane 23b determined according to the upper surface 21b of the component body 21, the external electrodes 22 do not cause an increase in the thickness of the component.

Figure 5:
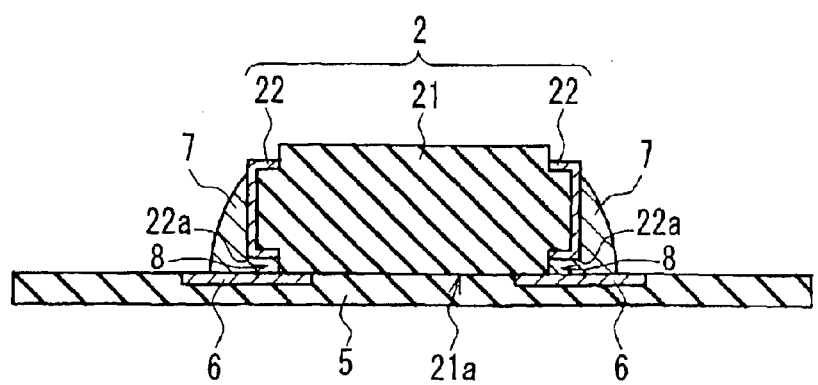
FIG. 5 is a cross-sectional view illustrating another embodiment of a circuit component package of the present invention.

FIG. 5 is a cross-sectional view of a circuit component package obtained by mounting the circuit component 2 on a mounting member composed of a circuit board 5 and a wiring pattern 6 provided thereon. In the present embodiment, the wiring pattern 6 is arranged on the circuit board 5, and the wiring pattern 6 and the external electrodes 22 of the circuit component 2 are connected electrically via a conductive material 7. In the present embodiment, the circuit pattern 6 is embedded so as not to protrude from a surface of the circuit board 5, so that a surface of the wiring pattern 6 and the surface of the circuit board 5 are positioned substantially in the same plane. Though the mount surface 21 of the component body 21 of the circuit component 2 is in contact with the circuit board 5, a gap 8 is provided between the lower surface 22a of each external electrode 22 and the wiring pattern 6 provided on the circuit board 5, since the external electrode 22 of the circuit component 2 is arranged in the upper region with respect to the mount reference plane 23a.

Thus, with the circuit component 2 configured so that a gap is provided between each external electrode 22 and the mounting member when the component is mounted, it is possible to connect the circuit component 2 with the wiring pattern 6 electrically without forming a gap between the component body 21 of the circuit component 2 and the mounting member in a state in which the circuit component 2 is mounted on the mounting member. Therefore, it is possible to achieve the same effects as those in the case where the circuit component 1 according to Embodiment 1 is used.

Further, in the present embodiment, since the wiring pattern 6 does not protrude from the surface of the circuit board 5, it is less likely that the protrusion of the wiring pattern 6 makes the component body 21 of the circuit component 2 unfixed on the circuit board surface. Therefore, a distance between lands that the wiring pattern 6 include for use in mounting a circuit component need not exceed a distance between the two external electrodes 22 arranged at the ends of the circuit component 2, and hence, the freedom in the wiring pattern design and the circuit component mounting is enhanced further.

It should be noted that the circuit component 2 of the present embodiment is configured so that, as shown in FIGS. 4A and 4B, on a side opposite to the mount surface side, that is, on the upper surface side, the external electrodes 22 are formed only on surfaces of the thinned portions of component body 21, but the external electrodes may be formed also on a surface of a non-thinned portion of the component body 11 on the upper side.

Next, the following will describe an embodiment of a method for producing a circuit component according to the present invention. FIGS. 6A to 6F are cross-sectional views illustrating respective steps of the method for producing the circuit component 2.

Figure 6A:
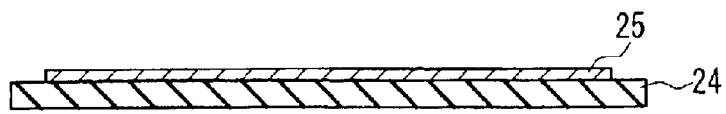
FIGS. 6A to 6F are cross-sectional views illustrating respective steps of a method for producing the circuit component shown in FIGS. 4A and 4B.

As shown in FIG. 6A, a conductive paste 25 containing a metal powder and an organic binder is applied (printed) on a predetermined region on a green sheet 24 that is obtained by forming a mixture containing an inorganic powder and an organic binder in a sheet form.

Figure 6B:
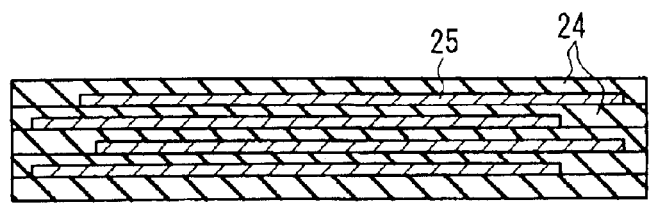
Figure 6C:
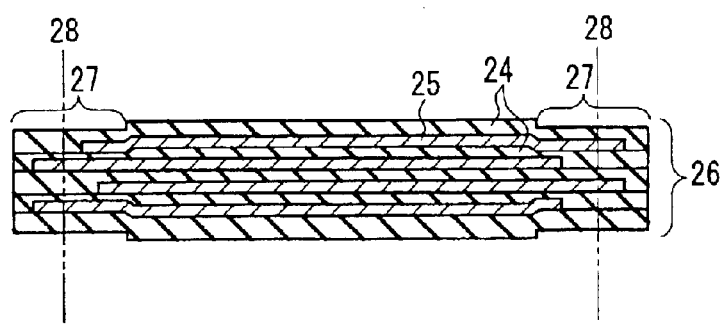
Figure 6D:
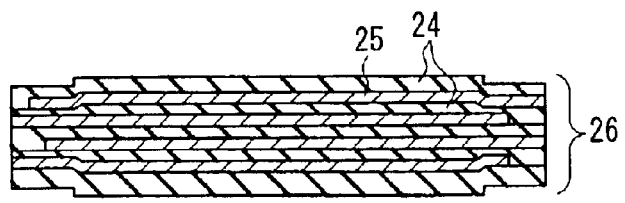

Next, a shown in FIG. 6B, a plurality of the green sheets 24 on which the conductive paste 25 is printed are prepared and stacked on one another. On the topmost layer of the stack thus obtained, another green sheet 24 on which the conductive paste 25 is not printed is stacked, and thereafter, a pressure is applied to the stack in a stacking direction, whereby a stack 26 of the green sheets as shown in FIG. 6C is produced. It should be noted that the pressure application is carried out in a manner such that the end portions on which the external electrodes are to be formed should be compressed to become thinner than the other portion. By so doing, thinned portions 27 are formed at the both ends. Thereafter, by cutting the end portions at predetermined cutting positions 28, a stack having a predetermined size as shown in FIG. 6D is formed.

Figure 6E:
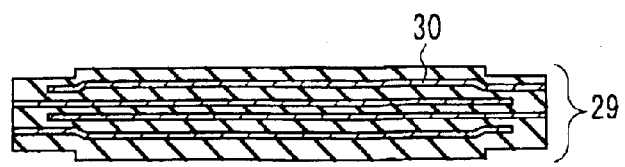

Next, by sintering the stack 26, a sintered ceramic 29 as shown in FIG. 6E is provided, which incorporates an internal electrode 30 having a comb structure and which is shaped so that a thickness of the end portions on which external electrodes are formed is smaller than a thickness of the other portion (center portion).

Figure 6F:
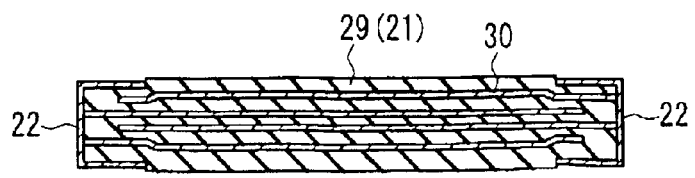

Thereafter, as shown in FIG. 6F, the external electrodes 22 are formed on surfaces of the end portions of the sintered ceramic 29 (corresponding to the component body 21). It should be noted that though the external electrodes 22 are formed over entire surfaces of the end portions of the sintered ceramic 29 in the circuit component 2 of the present embodiment, they may be formed at least partially on the end portions.

As a method for forming the thinned portions 27, for instance, a method of pressing the stack 26 using a plate having projections in regions corresponding the regions where to the thinned portions 27 are to be formed may be used. Further, though the thinned portions 27 are formed when the green sheets 24 are stacked and thereafter the stack obtained is cut in the present embodiment, the thinning may be carried out by stacking and cutting the green sheets 24 and thereafter compressing the end portions thereof.

It should be noted that the green sheets 24 can be produced by the same method and with the same materials as those of the method for producing the green sheets 14 in Embodiment 1 described above. Further, the conductive paste 25 can be produced by the same method and with the same materials as those for the conductive paste 15 in Embodiment 1 described above. Still further, the same sintering temperature and ambient atmosphere as those of Embodiment 1 are applicable in sintering the stack 26 for producing the sintered ceramic 29. Still further, the external electrodes 22 can be formed by the same method and with the same materials as those for the external electrodes 12 in Embodiment 1 described above.

It should be noted that though the external electrodes 22 of the present embodiment are formed so as to be positioned on a lower side with respect to the upper surface 21b of the component body 21, they need not be configured as such. They may be configured so that at least the lower surfaces 22a are positioned on an upper side with respect to mount reference plane 23a. Therefore, as a circuit component 3 shown in FIGS. 7A and 7B, the circuit component may be configured so that external electrodes 32 are not necessarily arranged on a lower side with respect to a height reference plane 33b determined according to an upper surface 31b of a component body 31. It should be noted that in FIG. 7B, 31a denotes a mount surface of the component body 31, 32a denotes a lower surface of the external electrode 32, and 33a denotes a mount reference surface.

Still further, in the case where such a circuit component 3 is produced by a method shown in FIGS. 6A to 6F, the compression of the stack 26 for forming the thinned portions 27 preferably is carried out by compressing the same only from the lower side, instead of compressing the same from both of the upper and lower sides. The other steps may be the same as those described with reference to FIGS. 6A to 6F.

Still further, the circuit component 3 may be produced by another method. FIGS. 8A to 8E show another example of the method for producing the circuit component 3.

Figure 8A:
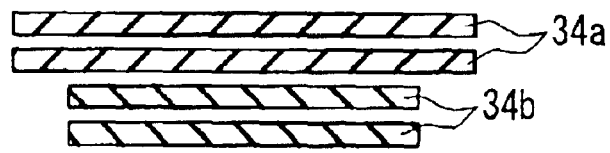
FIGS. 8A to 8E are cross-sectional views illustrating respective steps of a method for producing the circuit component shown in FIGS. 7A and 7B.

First, as shown in FIG. 8A, two types of green sheets with different lengths are prepared, which are first green sheets 34a cut in a desired shape and second green sheets 34b shorter at least in one direction than the first green sheet 34a.

Figure 8B:
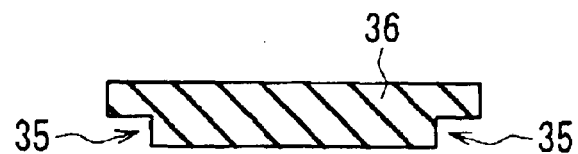

The green sheets 34a and 34b are stacked in a length increasing order, and are sintered, so that a thin ceramic substrate 36 as shown in FIG. 8B is formed which has notches 35 on both end portions on a lower side so that both the end portions on which external electrodes are to be formed are thinner than the other portion (center portion).

Figure 8C:
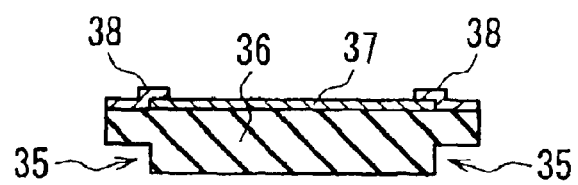
Figure 8D:
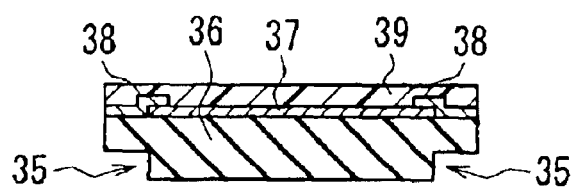

Next, as shown in FIG. 8C, a mixture 37 containing an inorganic powder, and an organic binder or a thermosetting resin, is printed on a larger surface of the ceramic substrate 36 (upper surface in the drawing). Further, on both ends thereof, a conductive mixture 38 containing a metal powder and an organic binder or a thermosetting resin is printed. After curing or sintering the printed material, the printed surface is sealed with a thermosetting resin 39 as shown in FIG. 8D.

Figure 7A:
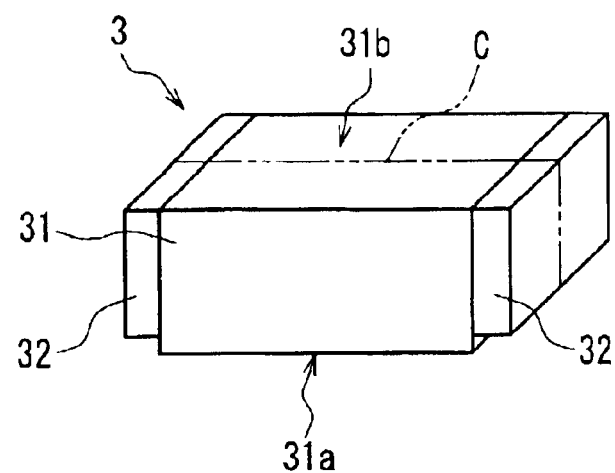
FIG. 7A is a perspective view illustrating still another embodiment of a circuit component of the present invention.
Figure 7B:
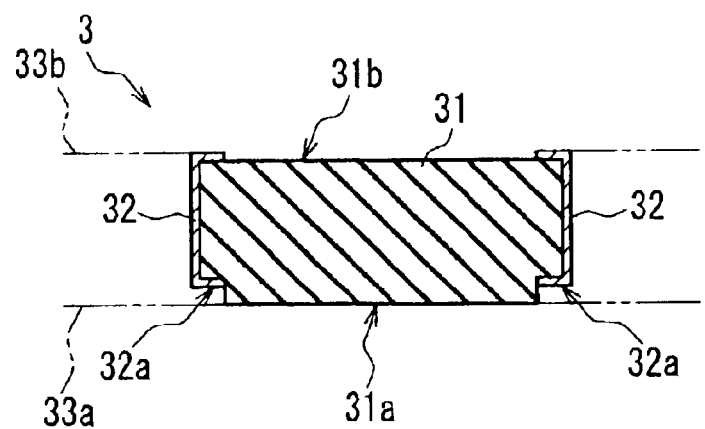
FIG. 7B is a cross-sectional view of the circuit component shown in FIG. 7A taken along a chain double-dashed line C.
Figure 8E:
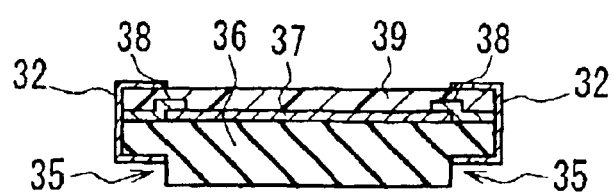

Thereafter, as shown in FIG. 8E, the external electrodes 32 are formed over entire surfaces of both the end portions that are thinner than the center portion. Thus, the circuit component 3 is formed as shown in FIGS. 7A and 7B that has a configuration such that lower surfaces 32a of the external electrodes 32 have a level difference with respect to a mount surface 31a of the component body 31. It should be noted that though in the circuit component 3 the external electrodes 32 are formed over entire ends, the external electrodes 32 may be formed at least on a part of each end.

The mixture 37 may be selected according to the function of the circuit component 3. For instance, in the case where the circuit component 3 is used as a resistor, carbon, ruthenium oxide, or the like can be used as the inorganic powder contained in the mixture 37. As the organic binder, the same material as that used in the green sheet 14 of Embodiment 1 described above can be used. Examples of a material used as the thermosetting resin include epoxy resins, phenol resins, cyanate resins, and imide resins. A material used for forming the metal powder contained in the conductive mixture 38 is a metal selected from the group consisting of Ag, Pd, Au, Cu, Ni, and Al, or an alloy or a mixture of any of them.

Further, as the organic binder or the thermosetting resin for use in the conductive mixture 38, the same materials as those applicable for forming the organic binder in the mixture 37 can be used.

An epoxy resin, for instance, can be used as the thermosetting resin 39. Further, an inorganic powder may be mixed in the thermosetting resin 39, and examples of the inorganic powder in this case include silica, calcium carbonate, alumina, etc. As a sealing method using the thermosetting resin 39, transfer molding, printing, potting, or the like is applicable. Though herein the thermosetting resin 39 is used for sealing the printed surface, the materials used for sealing and the sealing method are not limited as long as the circuit portion on which the mixture 37 is printed can be protected. For instance, in the case where the mixture 37 is baked on the ceramic substrate 36, a glass paste or a glass-ceramic paste may be printed thereon so as to form an overcoat, whereby the circuit portion is sealed.

It should be noted that an internal structure of the circuit component 3 shown in FIGS. 7A and 7B may be formed so as to have an internal electrode having a comb structure, as in the circuit components 1 and 2.

The circuit component package of the present embodiment is formed by mounting the circuit component 2 or 3 produced as described above on a mounting member. More specifically, it can be produced by the same method as that for producing the circuit component package of Embodiment 1 described above.

Embodiment 3

The following will describe an embodiment of a circuit component according to the present invention, while referring to the drawings.

Figure 9A:
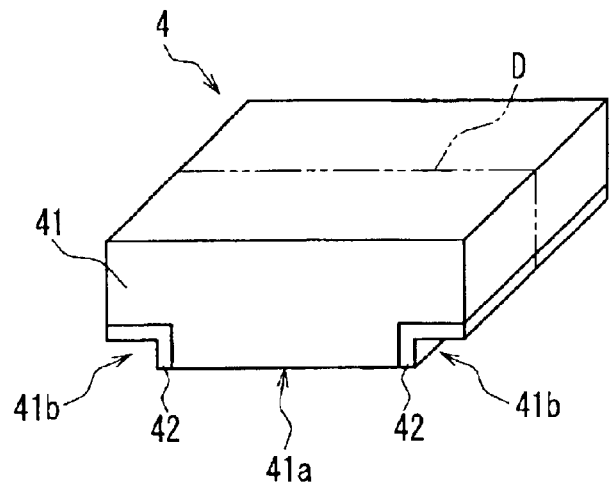
FIG. 9A is a perspective view illustrating still another embodiment of a circuit component of the present invention.
Figure 9B:
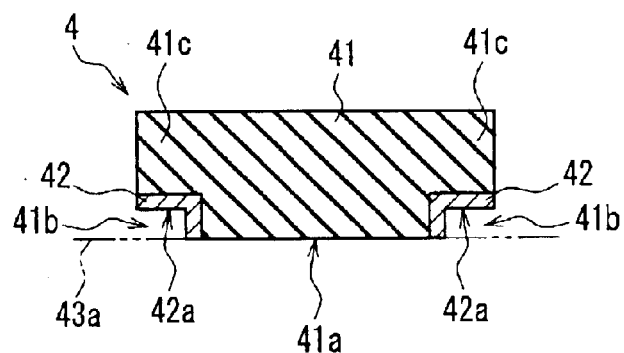
FIG. 9B is a cross-sectional view of the circuit component shown in FIG. 9A taken along a chain double-dashed line D.

FIG. 9A is a perspective view illustrating a circuit component 4 of the present embodiment, and FIG. 9B is a cross-sectional view of the circuit component 4 shown in FIG. 9A, taken along a double chain dashed line D.

The circuit component 4 includes a component body 41 that has notches 41b at both ends (first portions) of a mount surface 41a, and external electrodes 22 arranged on surfaces of the notches 41b. In FIGS. 9A and 9B, a lower surface of the component body 41 is the mount surface 41a that is a predetermined surface of the component body 41, and as shown in FIG. 9B, a mount reference plane 43a is determined according to the mount surface 41. It should be noted that the mount surface 41a is a surface of the component body 41 that is opposed to a mounting member when the circuit component 4 is mounted on the mounting member, and the mount reference plane 43a is a plane including the mount surface 41a of the component body 41. For convenience, herein, a side on which the component body 41 is positioned with respect to the mount reference plane 43a is referred to as an upper side, and a side opposite to the foregoing side, that is, a side on which the mounting member is positioned when the circuit component 4 is mounted on the mounting member is referred to as a lower side.

In the circuit component 4, external electrodes 42 are arranged on parts of surfaces of the end portions of the component body 41 (on the surfaces of the notches 41b), and in a region on a side where the component body 41 is arranged with respect to the mount reference plane 43a, that is, on an upper side with respect to the mount reference plane 43a. In the component body 41, each portion 41c on which the external electrode 42 is arranged has the notch 41b, and hence, it is thinner than the other portion (center portion, second portion). A distance between a lower surface 42a of the electrode 42 that is opposed to the mount reference plane 43a (hereinafter referred to as a lower surface 42a) and the mount reference plane 43a may be set so that a gap is formed between the lower surface 42a of the external electrode 42 and the mount reference plane 43a when the circuit component 4 is mounted on a mounting member, and preferably is set to be not less than 30 μm. Further, the distance between the lower surface 42a of the external electrode 42 and the mount reference plane 43a preferably is set to be not more than 100 μm, since in the case where the gap is too large, a distance of connection between the external electrodes and a component-side surface of the mounting member increases, which tends to cause an increase in a resistance or deterioration of reliability.

Figure 10:
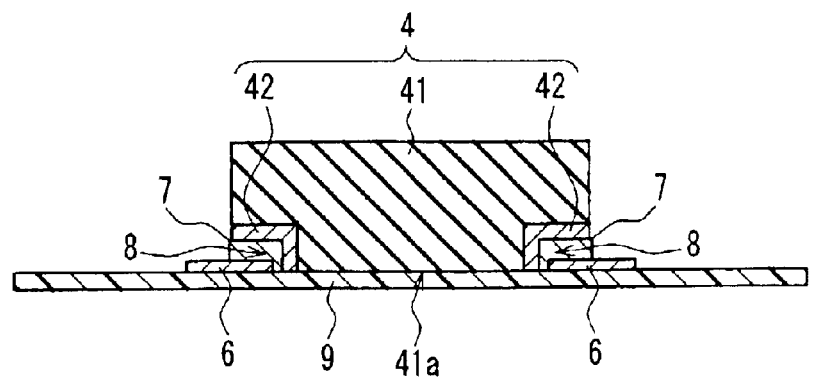
FIG. 10 is a cross-sectional view illustrating still another embodiment of a circuit component package of the present invention.

FIG. 10 is a cross-sectional view of a circuit component package obtained by mounting the circuit component 4 on a mounting member composed of a carrier film (substrate) 9 and a wiring pattern 6 provided thereon. In the present embodiment, the wiring pattern 6 is provided on the carrier film 9, and the wiring pattern 6 are connected electrically with the external electrode 42 of the circuit component 4 via a conductive material 7. Though the component body 41 of the circuit component 4 is in contact with the carrier film 9 in a state in which he circuit component 4 is mounted on the mounting member, a gap 8 is provided between each external electrode 42 and the wiring pattern 6 provided on the carrier film 9. The conductive material 7 is provided in the gap 8, and the external electrode 42 and the wiring pattern 6 are connected via the conductive material 7.

As the carrier film 9, a metal film or a resin film can be used, for instance. As the metal film, a metal film made of Cu, Al, Ni, or the like can be used. As the resin film, a film made of PET (polyethylene terephthalate), PPS (polyphenylene sulfide), polyimide, or the like can be used.

Thus, with the circuit component 4 configured so that a gap is provided between each external electrode 42 and the mounting member when the component is mounted, it is possible to connect the circuit component 4 with the wiring pattern 6 electrically without forming a gap between the component body 41 of the circuit component 4 and the mounting member in a state in which the circuit component 4 is mounted on the mounting member. Therefore, it is possible to achieve the same effects as those in the case where the circuit component 1, 2, of 3 according to Embodiment 1 or 2 is used. Further, since the external electrodes 42 are formed only on the mount surface side of the circuit component 4; in the case where a low-melting metal such as a solder is used as the conductive material 7, it is possible to prevent the conductive material 7 from forming a fillet at an end of the circuit component 4. This enables to suppress an increase in the area and volume necessary around the component, thereby allowing the mounting of components at a high density and enhancing the reliability of the connection between components and the reliability of the connection between layers.

It should be noted that though the carrier film 9 is used as a substrate of the mounting member of the circuit component package in the present embodiment, the circuit board 5 may be used as in the circuit component package of Embodiment 1 or 2 described above. Further, it also is possible to use the carrier film 9 as a substrate of the mounting member of the circuit component package of Embodiment 1 or 2 described above.

The following will describe an embodiment of a method for producing a circuit component according to the present invention. FIGS. 11A to 11G are cross-sectional views illustrating respective steps of the method for producing the circuit component 4.

As shown in FIG. 11A, a first green sheet 44a cut into a desired shape, and a second green sheet 44b having a shorter length in one direction than that of the first green sheet 44a, are prepared. Then, as shown in FIG. 11B, through holes 45 are formed at predetermined positions in the green sheets 44a and 44b.

Further, as shown in FIG. 11C, a via paste 46 that is a mixture of a metal powder and an organic binder is filled in the through holes 45. A conductive paste 47 that is a mixture containing a metal powder and an organic binder is printed on predetermined regions on upper surfaces of the green sheets 44a and 44b, as shown in FIG. 11D. A plurality of the first and second green sheets 44a and 44b are prepared, and are stacked in a length increasing order and sintered, as shown in FIG. 11E. As a result, a sintered ceramic 50 (corresponding to the component body 41) is produced that has a multilayer internal wiring 49 therein and has notches 48 at both ends of a lower surface (a surface to become a mount surface when finished) as shown in FIG. 11F.

Finally, external electrodes 42 are formed on surfaces of the notches 48 of the sintered ceramic 50 as shown in FIG. 11G, whereby the circuit component 4 is completed.

As the metal powder and the organic binder used in the via paste 46 and the conductive paste 47, the same materials as those used for forming the conductive paste 15 of Embodiment 1 described above can be used. Further, the method for forming the external electrodes 42 is not limited particularly, and examples of the method include a method of applying a conductive paste and sintering the same, a method of forming a thin film by vapor deposition or sputtering, the plating method, etc.

The method for forming the through holes 45 is not limited particularly, and examples of the method include a punching method using a punching machine, a punching method using a die, and a method using a carbonic gas laser.

It should be noted that though in the present embodiment the circuit component 4 is produced by using the green sheets 44a and 44b and sintering a stack of these green sheets, the circuit component 4 may be formed by the following method with the following materials. Sheet-like members containing a conductive resin composition are produced by the same method as that shown in FIGS. 11A to 11E, by using sheet-like members made of a mixture containing at least an inorganic powder and a thermosetting resin in place of the green sheets 44a and 44b, and using a conductive resin composition containing at least a metal powder and a thermosetting resin in place of the via paste 46 and the conductive paste 47. The sheet-like members thus produced are stacked, and the stack is subjected to heat treatment at which the thermosetting resin is cured as well as pressure. Thus, a cured body having a multilayer internal wiring is produced. In this method as well, external electrodes are formed at a final stage as shown in FIG. 11G. This method is advantageous from the viewpoint of industrial applicability since the circuit component 4 can be produced at a low temperature. Further, in the circuit component producing methods of Embodiments 1 and 2, it is possible to use the foregoing sheet-like members and the conductive resin composition.

Examples of the inorganic powder used for forming the sheet-like member include the same materials as those of the inorganic powder used for forming the green sheet 14 of Embodiment 1 described above. Further, examples of the thermosetting resin include epoxy resins, phenol resins, cyanate resins, PPE (polyphenylene ether), etc.

Further, the circuit components of the respective embodiments described above may have edge portions and apex portions polished as required. This is preferable since this prevents the circuit component from being chipped.

As the polishing method, barrel polishing is applicable, for instance.

It should be noted though a method for producing the circuit component 4 incorporating a multilayer internal wiring is described in the description of the present embodiment, the circuit component 4 need not incorporate a multilayer wiring. Therefore, the configuration of the circuit component 4 may be achieved by producing the ceramic substrate by the method as shown in FIGS. 8A to 8E, and thereafter forming the external electrodes on surfaces of the notches.

Figure 12A:
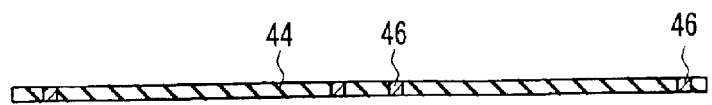
FIGS. 12A to 12G are cross-sectional views illustrating respective steps of a method for producing the circuit component shown in FIGS. 9A and 9B.
Figure 12B:
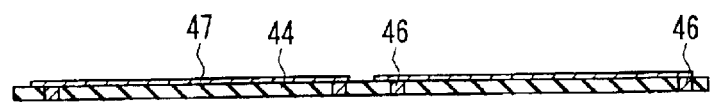
Figure 12C:
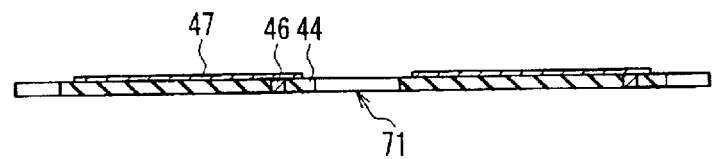
Figure 12D:
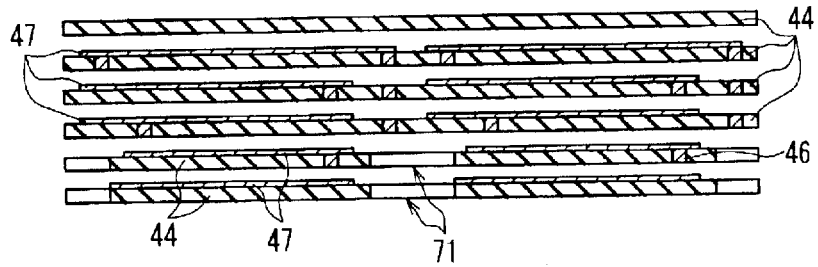
Figure 12E:
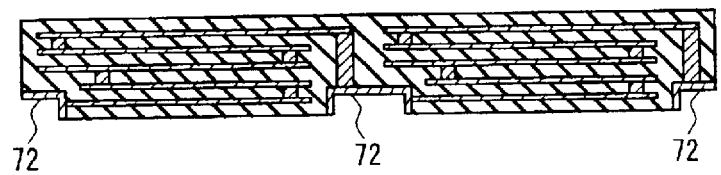
Figure 12F:
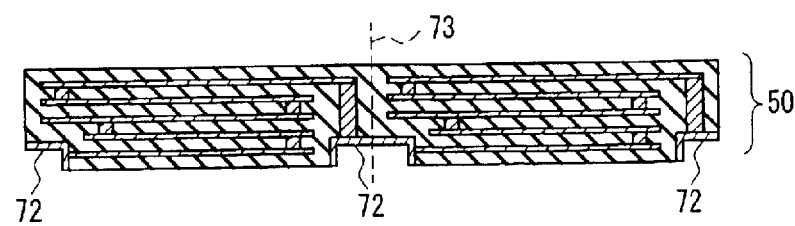
Figure 12G:
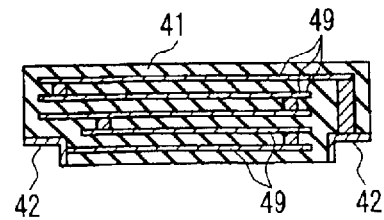

Still further, as the method for forming the circuit component 4, another method shown in FIGS. 12A to 12G is applicable. First, as shown in FIG. 12A, the via paste 46 that is a mixture containing a metal powder and an organic binder is filled in the through holes provided at predetermined positions in the green sheet 44. Then, as shown in FIG. 12B, the conductive paste 47 that is a mixture of a metal powder and an organic binder is printed on a predetermined region on an upper surface of the green sheet 44. Further, as shown in FIG. 12C, openings 71 are provided in predetermined regions in each of some green sheets 44. In other words, two types of green sheets are prepared, that is, a plurality of green sheets of one type, each of which has openings 71 at predetermined positions and a plurality of green sheets of the other type without an opening. Next, as shown in FIG. 12D, the green sheets 44 are stacked in a manner such that the green sheet 44 with the openings 71 is arranged on a surface on one side while the green sheet 44 without the opening 71 is arranged on a surface on the other side, whereby a stack is produced. Thereafter, as shown in FIG. 12E, a conductive paste 72 is applied on an inside surface of the opening 71, and sintered. As shown in FIG. 12F, the sintered ceramic thus produced is divided at a dividing position 73 corresponding to a position of a substantial center of each opening having the inside surface coated with the conductive paste 72. Thus, a plurality of circuit components can be produced, each of which incorporates a multilayer internal wiring 49, has notches at both ends of a lower surface, and has external electrodes 42 on surfaces of the notches as shown in FIG. 12G (as shown in FIG. 9 also).

A circuit component package of the present embodiment is formed by mounting the circuit component 4 thus produced on a mounting member. More specifically, the circuit component package can be produced by the same method as that for forming the circuit component package of Embodiment 1 described above.

Embodiment 4

The following will describe an embodiment of a circuit component built-in module according to the present invention, while referring to the drawings.

Figure 13:
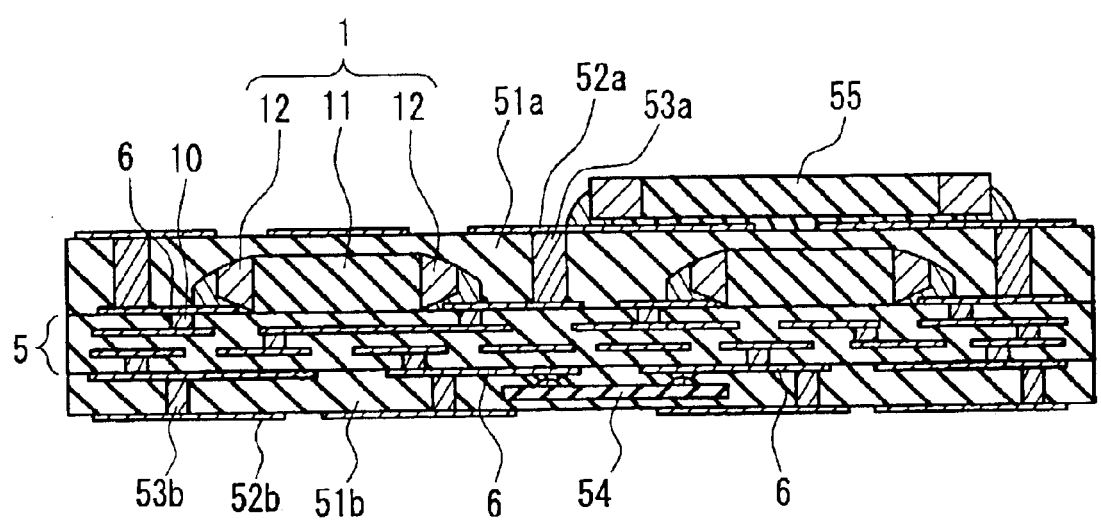
FIG. 13 is a cross-sectional view illustrating an embodiment of a circuit component built-in module of the present invention.

FIG. 13 is a cross-sectional view illustrating a configuration of a circuit component built-in module of the present embodiment. The circuit component built-in module of the present embodiment is produced using a circuit component package of Embodiment 1 described above (a circuit component package obtained by mounting the circuit component 1 on the circuit board 5 on which the wiring pattern 6 is formed), in which the circuit component 1 is embedded in an electric insulation member 51a. On surfaces of and inside the circuit board 5, a plurality of layers of wiring pattern 6 (first wiring pattern) are provided. Among the wiring patterns 6 provided in and on the circuit board 5, those in different layers are connected electrically through inner via 10. On a surface of the electric insulation member 51a in which the circuit component 1 is embedded, a wiring pattern 52a (second wiring pattern) is arranged, so as to be connected with the wiring patterns 6 provided in and on the circuit board 5, through inner vias 53a. Further, the electric insulation member 51a is extended to cover a surface portion of the circuit substrate 5 where the circuit component 1 is not mounted, and likewise, a wiring pattern 52a is arranged on the electric insulation member 51 and is connected electrically with wiring patterns 6 in and on the circuit board 5 though inner vias 53b. A semiconductor chip 54 is embedded in the electric insulation member 51a, and is connected electrically with a wiring pattern 6 provided on a surface of the circuit board 5. On the wiring pattern 52a arranged on an outer surface of the circuit component built-in module thus configured, another component 55 is mounted.

As described above, according to the circuit component built-in module of the present embodiment in which the electric connection among respective components is three-dimensional, the large-scale space-saving and volume-saving of a circuit block is achieved. Therefore, a highly dense and highly reliable module is provided.

The circuit board 5 is not limited particularly, and a commonly used printed circuit board, ceramic board, etc. can be used. However, a circuit board in which the multilayer wiring structure is formed using the same electric insulation material as that used for forming the electric insulation members 51a and 51b is used preferably, since this configuration eliminates a thermal expansion difference between the multilayer wiring structure and the electric insulation members 51 and 51b, thereby achieving high reliability.

The electric insulation members 51a and 51b are made of a mixture containing at least an inorganic filler and a thermosetting resin. A material used as the inorganic filler may be determined appropriately according to a linear expansivity, a heat conductivity, an elastic constant, etc. of a component to be embedded. Examples of the material include $Al_2O_3$, $SiO_2$, SiC, AlN, $Si_3N_4$, BN, etc. In the case where $Al_2O_3$ or $SiO_2$ is used as an inorganic filler, this makes the mixing of the inorganic filler easier, thereby allowing for the high-density filling. In the case where $SiO_2$ is used as the inorganic filler, it decreases the dielectric constant of the electric insulation members 51a and 51b. Therefore, the use of $SiO_2$ is preferable considering that it is advantageous for high-speed signal actions. Still further, in the case where $Al_2O_3$, AlN, or $Si_3N_4$ is used as the inorganic filler, the electric insulation members 51a and 51b have a higher heat conductivity. Therefore, the use of $Al_2O_3$, AlN, or $Si_3N_4$ is preferable considering that the temperature rise in the built-in components can be reduced. Examples of the applicable thermosetting resin include epoxy resins, phenol resins, cyanate resins, and PPE (polyphenylene ether), etc. The use of the same is preferable considering that they have high electric reliability and high strength. Further, a content of an inorganic filler in an entirety of the electric insulation material preferably is 70 percent by weight (wt %) to 95 wt %. Still further, in addition to the inorganic filler and the thermosetting resin, a coupling agent, a dispersant, a colorant, a release agent, etc. may be added. As the coupling agent used herein, for instance, an epoxy-silane-based type, an amino-silane-based type, or a titanate-based type may be used.

It should be noted that though the circuit component built-in module according to the present embodiment shown in FIG. 13 incorporates a semiconductor chip 54 in addition to the circuit component 1, the module may be configured so that only the circuit component 1 may be embedded in the electric insulation members 51a and 51b, and the semiconductor chip 54 may be mounted on a surface of the module. Further, the component 55 is not necessarily provided, and if any, it may be selected appropriately. Still further, in the circuit component built-in module, the wiring patterns 6, 52a, and 52b in the respective layers are connected through the inner vias 10, 53a, and 53b, but plated through holes may be used instead.

Next, the following will describe an embodiment of a method for producing the circuit component built-in module according to the present invention. FIGS. 14A to 14H are cross-sectional views illustrating respective steps of a method for producing the circuit component built-in module shown in FIG. 13.

Figure 14:
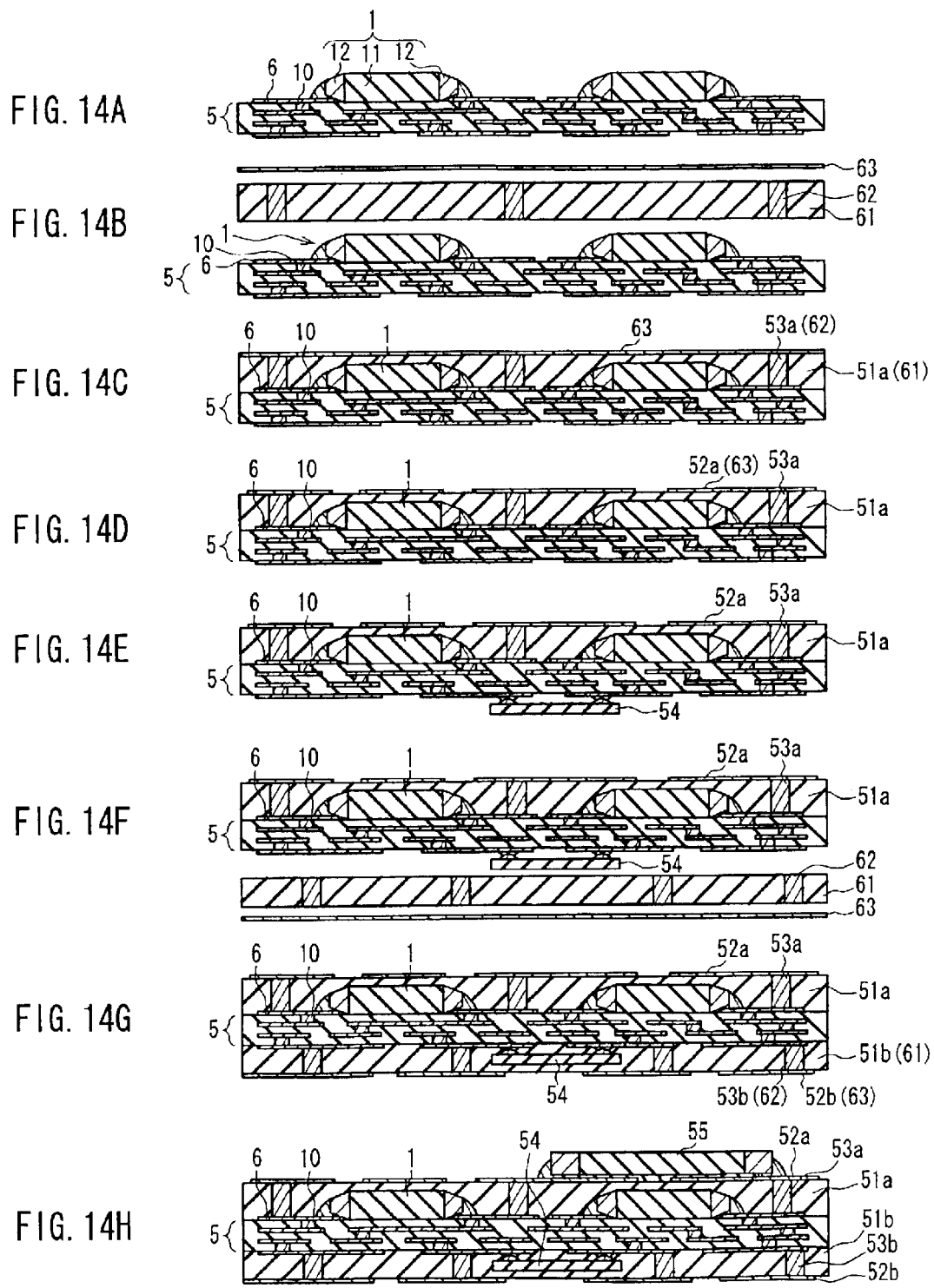
FIGS. 14A to 14H are cross-sectional views illustrating respective steps of a method for producing the circuit component built-in module shown in FIG. 13.

First of all, as shown in FIG. 14A, a circuit component package of embodiment 1 described above is prepared, in which the circuit component 1 is mounted on the circuit board 5 on which a wiring pattern 6 is provided.

Next, a mixture containing at least an inorganic filler and a non-cured thermosetting resin is formed in to a sheet form, so that a sheet-like insulator 61 is produced. Further, through holes are formed at predetermined positions in the sheet-like insulator 61, and a conductive resin composition 62 containing at least a metal powder and a thermosetting resin in a non-cured state is filled in the through holes. The sheet-like insulator 61 and a metal foil 63 with which a wiring pattern is to be formed are stacked in the stated order on the circuit component package, as shown in FIG. 14B. Thereafter, by subjecting the stack thus obtained to heat and pressure, the sheet-like insulator 61 flows, thereby causing the circuit component 1 to be embedded in the sheet-like insulator 61, while the thermosetting resins contained in the sheet-like insulator 61 and the conductive resin composition 62 are cured, whereby the stack is integrated. Thus, the sheet-like insulator 61 forms the electric insulation member 51a, and the conductive resin composition 62 forms the inner vias 53a, as shown in FIG. 14C.

Thereafter, as shown in FIG. 14D, the metal foil 63 is processed so as to form the wiring pattern 52a.

Further, as shown in FIG. 14E, a semiconductor chip 54 is mounted on a surface of the circuit board 5 on which the circuit component 1 is not mounted. Thereafter, as shown in FIG. 14F, the same sheet-like insulator 61 and metal foil 63 as those shown in FIG. 14B are stacked thereon, and the stack is subjected to heat and pressure. By so doing, the semiconductor chip 54 is embedded in the sheet-like insulator 61, while the thermosetting resins contained in the sheet-like insulator 61 and the conductive resin composition 62 are cured, whereby the stack is integrated. Thus, the sheet-like insulator 61 forms the electric insulation member 51b and the conductive resin composition 62 forms the inner vias 53b, as shown in FIG. 14G. Further, the metal foil 63 is processed so as to form the wiring pattern 52b, whereby the circuit component built-in module as shown in FIG. 14G is produced.

Further, by mounting a component 55 on an outer surface of the circuit component built-in module as shown in FIG. 14H, the circuit component built-in module shown in FIG. 13 is completed.

It should be noted that though in the present embodiment the sheet-like insulators 61 are stacked on both principal surfaces of the circuit substrate 5 and the wiring patterns 52a and 52b are formed on surfaces of the same, additionally circuit components 1 may be mounted and sheet-like insulators 61 may be stacked on the wiring patterns 52a and 52b, so that a multilayer module is obtained.

It should be noted that the temperature during the application of heat and pressure described referring to FIGS. 14C and 14G may be determined according to curing temperatures of the thermosetting resins contained in the sheet-like insulator 61 and the conductive resin composition 62, but it preferably is set to be 140° C. to 210° C. normally. This is because if the temperature is lower than that, the thermosetting resins are cured insufficiently, and if the temperature is higher than that, the decomposition of the thermosetting resin, the malfunction of the components incorporated in the module, etc. tend to occur.

As a method for processing the metal foil 63 into wiring patterns 52a and 52b, chemical etching, for instance, is applicable.

Figure 15:
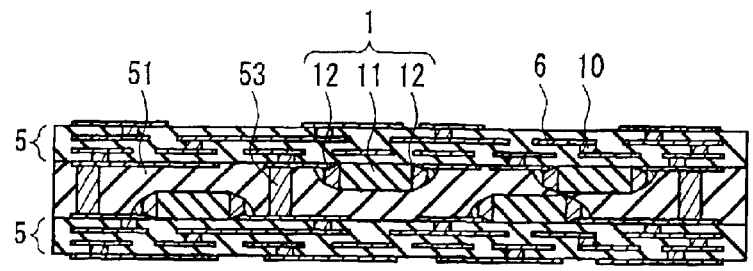
FIG. 15 is a cross-sectional view illustrating another embodiment of a circuit component built-in module of the present invention.

Another embodiment of the circuit component built-in module of the present invention may have a configuration shown in FIG. 15. In the circuit component built-in module, two circuit component packages each of which is obtained by mounting the circuit component 1 on the circuit board 5 are arranged so that surfaces thereof on each of which the circuit component 1 is mounted are opposed to each other, and an electric insulation member 51 is provided therebetween. The circuit components 1 mounted on the circuit component packages are built in the electric insulation member 51. On surfaces of the circuit boards 5 and inside the same, a plurality of layers of wiring patterns 6 are provided, some of which in different layers are connected electrically through inner vias 10. Further, the wiring patterns 6 provided on respective surfaces of the circuit boards 5 are connected electrically with each other via inner vias 53 provided in the electric insulation member 51.

Figure 16A:
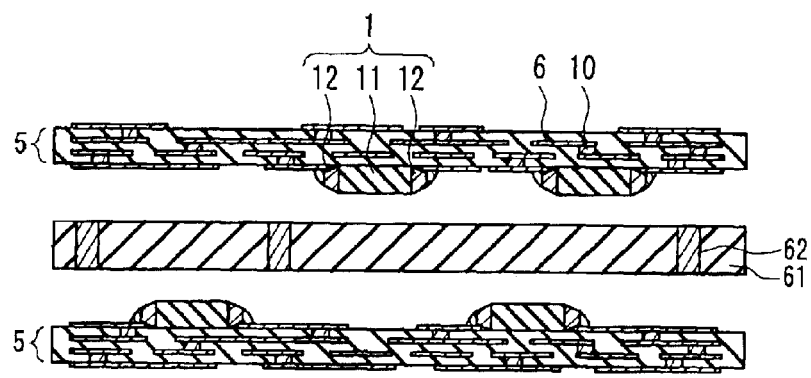
FIGS. 16A and 16B are cross-sectional views illustrating respective steps of a method for producing the circuit component built-in module shown in FIG. 15.
Figure 16B:
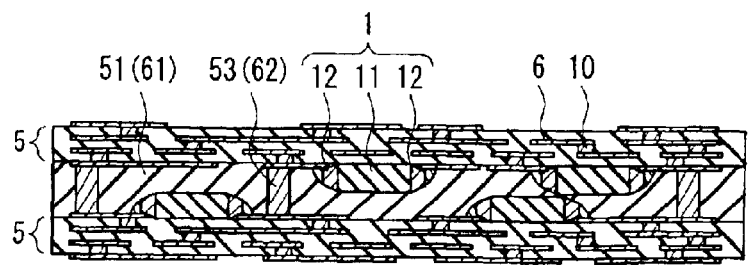

FIGS. 16A and 16B are cross-sectional views illustrating steps of a method for producing the circuit component built-in module shown in FIG. 15.

First of all, two circuit component packages of Embodiment 1 described above, each of which is formed by mounting the circuit component 1 on the circuit board 5, as well as a sheet-like insulator 61, are prepared. Next, as shown in FIG. 16A, the sheet-like insulator 61 is arranged between the two circuit component packages, and they are stacked in this state, whereby a stack is formed. Through holes are formed at predetermined positions in the sheet-like insulator 61, and are filled with a conductive resin composition 62. It should be noted that the sheet-like insulator 61 and the conductive resin composition 62 are the same as those described above. Thereafter, by applying heat and pressure to the stack, the circuit components 1 are embedded in the sheet-like insulator 61, while the sheet-like insulator 61 and the conductive resin composition 62 are cured, whereby all of these are provided integrally. As shown in FIG. 16B, the sheet-like insulator 61 becomes the electric insulation member 51, and the conductive resin composition 62 becomes inner vias 53.

It should be noted that as the method for producing a circuit component built-in module of the present embodiment, the method employing circuit component packages each of which is composed of the circuit component 1 and the mounting member including the circuit board 5 and the wiring pattern 6 is described. However, the method is not limited to this, but the same circuit component built-in module can be produced using the circuit component packages according to Embodiment 2 or 3. The following will describe a method for producing a circuit component built-in module by employing circuit component packages of Embodiment 3 described above, while referring to FIGS. 17A to 17D.

Figure 17A:
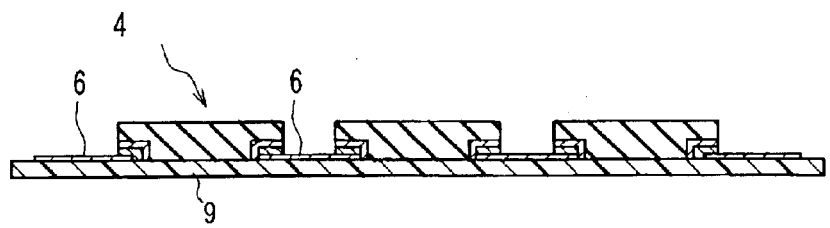
FIGS. 17A to 17D are cross-sectional views illustrating another embodiment of a method for producing a circuit component built-in module of the present invention.

First, as shown in FIG. 17A, a circuit component package of Embodiment 3 described above is prepared, which is configured so that circuit components 4 are mounted on a carrier film 9 on which wiring patterns 6 are provided.

Figure 17B:
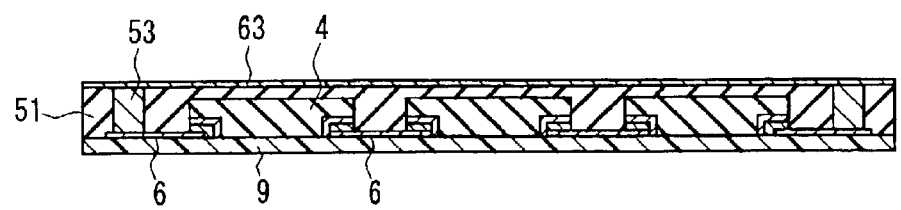

Then, a sheet-like insulator 61 having through holes filled with a conductive resin composition 62, and a metal foil 63 for forming wiring patterns, as shown in FIG. 14B, are stacked in this order on the circuit component package shown in FIG. 17A, and heat and pressure are applied thereto. By so doing, the circuit components 4 are embedded in the sheet-like insulator 61, and the thermosetting resins in the sheet-like insulator 61 and the conductive resin composition 62 are cured, whereby all of these are integrally provided. Thus, as shown in FIG. 17B, the sheet-like insulator 61 becomes an electric insulation member 51, and the conductive resin composition 62 becomes inner vias 53.

Figure 17C:
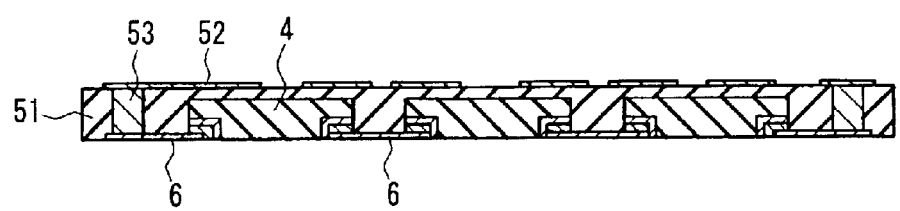
Figure 17D:
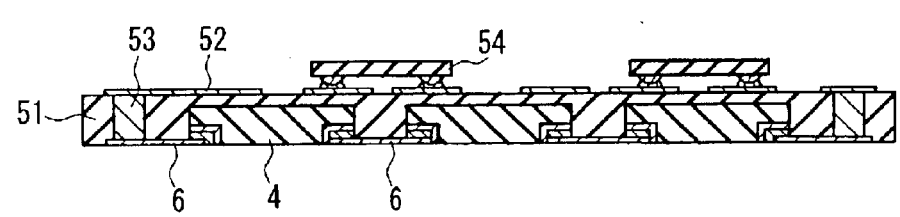
Figure 18:
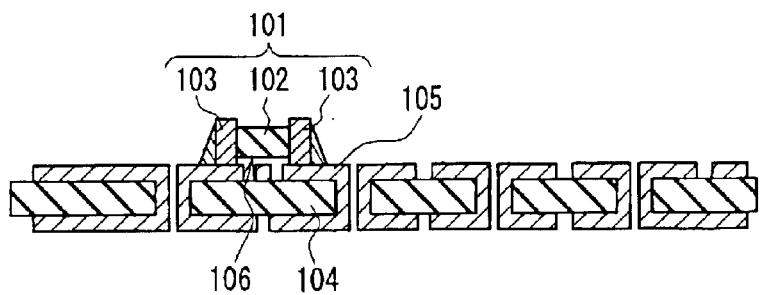
FIG. 18 is a cross-sectional view illustrating a conventional circuit component package.

Thereafter, the metal foil 63 is processed into wiring patterns 52, while the carrier film 9 is removed, so that the circuit component built-in module as shown in FIG. 17C is produced. Further, as shown in FIG. 17D, semiconductor chips 54 are mounted on a surface thereof, whereby a circuit component built-in module is completed.

According to the present embodiment, the circuit components 4 are connected with the wiring patterns 6 on the carrier film 9, a circuit substrate for holding the wiring pattern 6 becomes unnecessary, and a circuit component built-in module having a small thickness and a small volume is achieved.

Still further, in each of the above-described embodiments, a generally used metal foil may be used for forming the wiring pattern 6, and copper, aluminum, silver, or nickel can be used as the metal foil.

Still further, the circuit components 1 to 4 in the above-described embodiments are not particularly limited regarding their functions, but they preferably are capacitors, stacked ceramic capacitors, inductors, resistors, etc. This is because these components are relatively easy to shape desirably.

EXAMPLES

The following will describe in more detail a circuit component of the present invention, a circuit component package and a component built-in module of the present invention in each of which the circuit component is used, and methods for producing these.

Example 1

The following will describe, as Example 1, specific examples of the circuit component 1, the circuit component package, and the circuit component built-in module in which these are employed, according to Embodiment 1 described above.

First of all, a ceramic green sheet 14 used for forming the circuit component 1 is described. In the present example, $BaTiO_3$ powder (BT-03 produced by SAKAI CHEMICAL INDUSTRY CO., LTD, particle mean diameter: 0.3 $\mu$m), and a material functioning as an auxiliary agent, composed of $Mn_3O_4$ (Brownox produced by TOSOH CORPORATION), $Dy_2O_3$ (DSU produced by SHIN-ETSU CHEMICAL CO., LTD.), MgO (#5000 produced by TATEHO CHEMICAL INDUSTRIES CO., LTD.), $BaCO_3$ (F-03 produced by NIPPON CHEMICAL INDUSTRIES CO., LTD.), $CaCO_3$ (3N-B produced by UBE MATERIAL INDUSTRIES, LTD.), and $SiO_2$ (GR grade, produced by NACALAI TESQUE, INC.) were put into a pot so that $BaTiO_3$ accounted for approximately 99.2 wt %, and the auxiliary agent accounted for approximately 0.8 wt % in total, and the mixture was ground by ball milling using zirconia balls as the medium for approximately 20 hours. All the suspension obtained was dried in a drum dryer set at 120° C., whereby a powder was prepared. The dried powder was pulverized with an alumina mill, and was sieved by a 30-mesh screen to remove rough particles, whereby an inorganic powder was prepared. Next, an organic binder containing a butyral resin as a principal component, and the foregoing inorganic powder thus prepared, were mixed and dispersed by ball milling using zirconia ball as the medium for 6 hours, whereby a slurry was prepared. The slurry was formed into a film by doctor blading, whereby a green sheet with a thickness of approximately 6 μm was produced. Further, another green sheet with a thickness of 50 μm was produced in the same manner.

On the other hand, a nickel paste was prepared so as to be used as a conductive paste 15, and the nickel paste was printed on the green sheet with a thickness of 6 μm produced as described above, whereby an internal electrode pattern was formed as shown in FIG. 3A. Thereafter, 100 green sheets on each of which the nickel paste was printed so as to form the internal electrode pattern were stacked, and four green sheets with a thickness of 50 μm each were stacked on each of the upper and lower surfaces so as to form protective layers. These sheets were subjected to thermocompression bonding, a stack 16 as shown in FIG. 3B was produced. Thereafter, the stack 16 was cut into pieces, so that stacked green chips, 3.2 mm×1.6 mm each, were produced.

Next, the binder was removed from the stacked green chip, and the chip was sintered, so that a sintered ceramic 18 as shown in FIG. 3D was obtained. The removal of the binder was carried out by heating the stack to 400° C. in the ambient atmosphere by a heating rate of 15° C./hr, keeping the same at 400° C. for 5 hours, and cooling the same in the oven. The sintering was carried out by heating the same from room temperature to 900° C. at a heating rate of 200° C./hr in a nitrogen-hydrogen mixture gas, keeping the same at 900° C. for one hour, while a mass flow controller was operated so that the oxygen partial pressure was adjusted to be two orders of magnitude smaller than the equilibrium oxygen partial pressure for the oxidation reduction of nickel. Thereafter, while operating the mass flow controller so as to keep he foregoing oxygen partial pressure at every temperature, the temperature was raised to 1325° C. at a rate of 200° C./hr, and 1325° C. was kept for 2 hours, and then, the temperature was lowered to room temperature at a rate of 200° C./hr. Thereafter, the sintered ceramic 18 was subjected to barrel polishing so as to round the edges, and a copper paste was applied to portions on both ends as leads to the internal electrodes, whereby external electrodes 12 were formed. Further, nickel plating and solder plating were applied successively on surfaces of the electrodes 12, whereby a stacked chip capacitor having the same configuration as that of the circuit component 1 described above was produced.

A thickness of the stacked chip capacitor thus obtained was determined by a caliper gauge. The thickness of the center portion was determined to be 0.780 mm as an average of 50 pieces, while the thickness of the external electrode portion at each end was determined to be 0.615 mm as an average of 50 pieces.

To determine damage to the stacked chip capacitor produced as the present example when it was embedded, a stacked chip capacitor of the present example was mounted on a glass-epoxy printed circuit board (produced by MAT-SUSHITA ELECTRIC WORKS, LTD.) having copper foil wiring with a thickness of 35 μm. For mounting, a eutectic solder paste was used, and a reflow process was carried out with a reflow profile with a peak temperature of 230° C. Observing the mounted state of this, it was confirmed that the component body of the stacked chip capacitor was in contact with the wiring board in the same manner as that shown in FIG. 2, while the external electrodes were connected with the wiring pattern via the solder, and were not in direct contact with the wiring board.

The following will describe a method for producing the sheet-like insulator 61 that becomes the electric insulation member 51 in which the stacked chip capacitor of the present example is to be embedded.

First of all, an inorganic filler and a non-cured thermosetting resin were mixed so that a slurry was obtained. The composition of the mixture for forming the insulator was as follows: (i) 88 wt % of $Al_2O_3$ (AS-40 produced by SHOWA DENKO K. K.) as inorganic filler; (ii) 10 wt % of thermosetting resin: multifunctional epoxy resin (NVR-1010 produced by SANYU REC CO., LTD., containing a curing agent); (iii) other additives including 0.05 wt % of a hardening accelerator (IMIDAZOL produced by SANYU REC CO., LTD.), 0.4 wt % of carbon black (produced by TOYO CARBON CO., LTD.), and 0.55 wt % of a coupling agent (PLENACT KR46-B produced by AJINOMOTO-FINE-TECHNO CO., INC.).

Methyl ethyl ketone (MEK) was added as a solvent to these materials, and stirred by a bubble-removing stirring device (produced by MATSUO SANGYO CO., LTD.). The addition of MEK causes the viscosity of the mixture to decrease, making it possible to process the same into a slurry state, but MEK is not considered to be contained in the composition since it is removed through the subsequent drying process.

This slurry was coated by doctor blading on a film made of polyethylene terephthalate (PET) on which a releasing treatment was applied. Thereafter, the drying was carried out at 90° C., whereby the solvent was removed. Thus, the same as sheet-like insulator 61 shown in FIG. 14B was produced.

Separately, 87 wt % of copper powder (produced by MITSUI MINING & SMELTING CO., LTD.), 3 wt % of bisphenol-A-type epoxy resin (EPIKOTE 828 produced by JAPAN EPOXY RESINS CO., LTD.), 9 wt % of a glycidyl ester-based epoxy resin (YD-171 produced by NISSAN KASEI), and 1 wt % of an amine adduct curing agent (MY-24 produced by AJINOMOTO-FINE-TECHNO CO., INC.) were prepared and mixed with a three-roll mill, whereby a conductive resin composition 62 was produced.

At predetermined positions of the sheet-like insulator 61 described above, through holes having a diameter of 0.3 mm each were formed by the NC punching machine (produced by UHT CORP.), and the conductive resin composition 62 was filled in the through holes. The sheet-like insulator 61 thus formed was stacked on the printed circuit board on which the stacked chip capacitor was mounted, further on which a copper foil having a rough surface on one side, with a thickness of 18 μm, was stacked. Then, a heat and pressure treatment at 150° and 1 MPa were applied thereto for one hour, so that the stacked chip capacitor was embedded in the sheet-like insulator 61, while the sheet-like insulator 61 and the printed circuit board were integrally provided.

Example 2

The following will describe, as Example 2, specific examples of the circuit component 2, the circuit component package, and the circuit component built-in module in which these are employed, according to Embodiment 2 described above.

Green sheets were produced by the same method as that of Example 1, and a nickel paste produced separately was printed on the green sheets. Next, the green sheets were stacked in the same manner as that of Example 1. Thereafter, when the stack obtained was subjected to thermocompression bonding, a pair of flat plates having protrusions at positions corresponding to positions where external electrodes were to be formed in a subsequent process was used, whereby a stack 26 as shown in FIG. 6C was produced. Then, the stack was cut into pieces, so that stacked green chips, 3.2 mm×1.6 mm each, were produced, which had thinned ends on both sides as shown in FIG. 6D. Each stacked green chip was subjected to the same binder removing process, sintering process, barrel polishing for rounding edges, and external electrode forming process as those of Example 1, whereby a stacked chip capacitor having recesses at both ends as shown in FIG. 6F was produced.

A thickness of the stacked chip capacitor thus obtained was determined by a caliper gauge. The thickness of the center portion was determined to be 0.780 mm as an average of 50 pieces, while the thickness of the external electrode portion at each end was determined to be 0.540 mm as an average of 50 pieces.

This stacked chip capacitor was mounted on a printed circuit board by the same method as that of Example 1, and was embedded in the sheet-like insulator 61, whereby a circuit component built-in module was produced.

Example 3

The following will describe, as Example 3, specific examples of the circuit component 4, the circuit component package, and the circuit component built-in module in which these are employed, according to Embodiment 3 described above.

In the present example, a ceramic substrate was produced by low-temperature sintering, using green sheets. As materials for forming the green sheets of the present embodiment, 88 wt % of a mixture powder of $Al_2O_3$ and boron silicate glass (MLS-1000 produced by NIPPON ELECTRIC GLASS CO., LTD.), 10 wt % of polyvinyl butyral (produced by ASAHI KASEI CORPORATION), and 2 wt % of butyl benzyl phthalate (produced by KANTO KAGAKU) were prepared, to which toluene was added as a solvent. Then, alumina balls were added thereto, so that the mixture was subjected to ball milling and mixing for 48 hours in a pot. Thus, a slurry was prepared. Using this slurry, a plurality of green sheets with a thickness of approximately 0.22 mm were produced by doctor blading.

Separately, 75 wt % of silver powder (produced by MITSUI MINING & SMELTING CO., LTD.), 5 wt % of ethyl cellulose (produced by DOW CHEMICAL CO.), 15 wt % of terpineol (produced by KANTO KAGAKU), and 5 wt % of butyl benzyl phthalate (produced by KANTO KAGAKU) were prepared, milled by three-roll milling, whereby a conductive paste was produced.

The green sheet thus obtained was cut into a predetermined size, and through holes having a diameter of 0.15 mm each were formed using a punching machine. Further, 0.10 mm wide apertures were formed at predetermined positions in a predetermined number of green sheets among the plurality of the green sheets thus obtained, and the foregoing conductive paste was filled in the through holes by screen printing. Further, wiring patterns were printed on the green sheets.

A plurality of the green sheets thus produced were prepared, and stacked in a manner such that a green sheet having apertures was arranged on one side, while a green sheet without apertures was arranged on the other side, and were subjected to thermocompression bonding. Thus, a stack was prepared. Thereafter, the conductive paste was applied on internal walls of the apertures provided in the green sheets.

Thereafter, the binder removing process and the sintering process were carried out. The stack was heated in an electric oven to 500° C. at a rate of 25° C./hr, and was kept in air for 2 hours at 500° C., whereby the binder was removed. Thereafter, it was sintered in a belt oven at 900° C. for 20 minutes. Next, the sintered stack thus formed was cut at substantially the center position of each aperture, whereby a plurality of circuit components were produced. In the state where the stack was cut into a plurality of circuit components, the apertures of the green sheets formed notches 41b of the circuit component 4 shown in FIG. 4B, and further, the conductive paste applied on the internal walls of the apertures, as a result of being sintered, formed the external electrodes 42. Further in the present example, nickel plating and tin plating were applied to the external electrodes 42, whereby the circuit components 4, 3.2 mm×1.6 mm each in size, were completed.

The circuit component 4 thus produced was mounted on a printed circuit board in the same manner as that of Examples 1 and 2, and was embedded in the sheet-like insulator 61, whereby a circuit component built-in module was produced.

Comparative Example 1

In Comparative Example 1, a ceramic capacitor available from the market (produced by MATSUSHITA ELECTRIC INDUSTRIES CO., LTD., 3.2 mm×1.6 mm×0.85 mm) was used as a circuit component, and was mounted on a printed circuit board by the same method as that of Example 1. Here, a gap was produced between a component body of the ceramic capacitor and the printed circuit board. Furthermore, by the same method as that of Example 1, the ceramic capacitor was embedded in a sheet-like insulator 61, whereby a circuit component built-in module of Comparative Example 1 was produced.

Circuit component built-in modules of Examples 1 to 3 and Comparative Example 1 thus produced were observed using an X-ray transmission imaging device (produced by HITACHI CONSTRUCTION MACHINERY CO., LTD.), and it was determined whether cracks occurred to the circuit components. As a result, among the circuit component built-in modules of Examples 1 to 3, fifty being prepared for each example, none of them suffered from cracks of the circuit component. In contrast, among the circuit component built-in modules of Comparative Example 1, fifty being prepared, forty-five of them suffered from cracks of circuit components. Thus, it was found that the circuit components of Examples 1 to 3 were resistant to damage that would occur when the components were embedded in the electric insulation members.

As described above, the circuit component and circuit component package of the present invention hardly suffer from destruction of the same in a mounted state, and also hardly suffer form short-circuiting of wires due to, for instance, re-melting of a conductive material used in mounting the circuit component. Further, with the configuration of the circuit component of the present invention, high position accuracy is achieved when it is mounted on a wiring pattern. Still further, with the configuration of the circuit component built-in module of the present invention, a high-density and high-reliability circuit component built-in module can be achieved.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit component comprising:
   a component body; and
   an external electrode provided at an end of the component body,
   wherein
   the component body is shaped so that a first portion of the component body on which the external electrode is provided is thinner than a second portion of the component body, the second portion being a portion on which the external electrode is not provided, and a thickness of the first portion at a position where the first portion is thinnest is not more than 90% of a thickness of the second portion, and
   the external electrode is arranged in a region on a side on which the component body is positioned with respect to a reference plane containing a predetermined surface of the component body, the predetermined surface of the component body being a surface of the component body that is to be opposed to a mounting member when the circuit component is mounted on the mounting member.

2. The circuit component according to claim 1, wherein a surface of the external electrode that is opposed to the reference plane is tilted at a tilt angle of not less than 10° and not more than 50° with respect to the reference plane.

3. The circuit component according to claim 1, wherein a distance from the reference plane to a surface of the external electrode that is opposed to the reference plane at a position where the surface and the reference plane are separated farthest is not less than 30 $\mu$m and not more than 100 $\mu$m.

4. The circuit component according to claim 1, wherein the external electrode is arranged so as not to cross the reference plane.

5. The circuit component according to claim 1, wherein the circuit component is a surface-mountable chip component.

6. The circuit component according to claim 5, wherein the chip component is at least one selected from the group consisting of a resistor, a capacitor, and an inductor.

7. A circuit component package comprising:
   a mounting member including a substrate and a wiring pattern provided on the substrate;
   a circuit component including a component body and an external electrode provided at an end of the component body, the circuit component being arranged on the mounting member; and
   a conductive material that electrically connects the external electrode with the wiring pattern,
   wherein
   in the circuit component,
      the component body is shaped so that a first portion of the component body on which the external electrode is provided is thinner than a second portion of the component body, the second portion being a portion on which the external electrode is not provided, and
      the external electrode is arranged in a region on a side on which the component body is positioned with respect to a reference plane containing a predetermined surface of the component body, the predetermined surface of the component body being a surface of the component body that is to be opposed to the mounting member when the circuit component is mounted on the mounting member, and
   the circuit component is arranged on the mounting member so that the component body is in contact with the mounting member.

8. The circuit component package according to claim 7, wherein the wiring pattern does not protrude from a surface of the substrate.

9. The circuit component package according to claim 7, wherein the substrate is a circuit board containing an electric insulation material.

10. The circuit component package according to claim 9, wherein the circuit board has a multilayer wiring structure in which wiring patterns are arranged in a plurality of layers in the electric insulation material.

11. The circuit component package according to claim 7, wherein the substrate is a carrier film.

12. The circuit component package according to claim 7, wherein the conductive material is a conductive resin composition containing a solder, or a combination of a metal powder and a thermosetting resin.

13. The circuit component package according to claim 12, wherein the solder contains, as a principal component thereof, at least one kind of metal selected form the group consisting of Pb, Cu, Zn, Sn, Ag, and In.

14. The circuit component package according to claim 12, wherein the metal powder contains at least one kind of metal selected from the group consisting of Au, Ag, Cu, Ni, Pd, and Pt.

15. The circuit component package according to claim 7, wherein, in the component body, the thickness of the first portion at a position where the first portion is thinnest is not more than 90% of a thickness of the second portion.

16. The circuit component package according to claim 7, wherein the a surface of the external electrode that is opposed to the reference plane is tilted at a tilt angle of not less than 10° and not more than 50° with respect to the reference plane.

17. The circuit component package according to claim 7, wherein a distance from the reference plane to a surface of the external electrode of the circuit component that is opposed to the reference plane, at a position where the surface and the reference plane are separated farthest, is not less than 30 $\mu$m and not more than 100 $\mu$m.

18. The circuit component package according to claim 7, wherein the external electrode of the circuit component is arranged so as not to cross the reference plane.

19. The circuit component package according to claim 7, wherein the circuit component is a surface-mountable chip component.

20. The circuit component package according to claim 19, wherein the chip component is at least one selected from the group consisting of a resistor, a capacitor, and an inductor.

21. The circuit component package according to claim 7, wherein the conductive material does not protrude into a region on the mounting member side with respect to the reference plane, the mounting member side being a side on which the mounting member is positioned.

22. A circuit component built-in module comprising:
   a circuit component including a component body and an external electrode provided at an end of the component body;
   a first wiring pattern electrically connected with the external electrode of the circuit component;

a conductive material electrically connecting the external electrode with the first wiring pattern; and an electric insulation member incorporating the circuit component, wherein, in the circuit component, the component body is shaped so that a first portion of the component body on which the external electrode is provided is thinner than a second portion of the component body, the second portion being a portion on which the external electrode is not provided, and the external electrode is arranged in a region on a side on which the component body is positioned with respect to a reference plane that contains a predetermined surface of the component body, the predetermined surface of the component body being a surface of the component body that is to be opposed to a mounting member when the circuit component is mounted on the mounting member.

23. The circuit component built-in module according to claim 22, wherein the electric insulation member contains an inorganic filler and a thermosetting resin.

24. The circuit component built-in module according to claim 22, further comprising a second wiring pattern that is provided in or on the electric insulation member and that is connected electrically with the first wiring pattern.

25. The circuit component built-in module according to claim 24, wherein a plurality of the second wiring patterns are provided, and the first wiring pattern is connected electrically with at least one of the plurality of the second wiring patterns through an inner via provided in the electric insulation member.

26. The circuit component built-in module according to claim 22, wherein the first wiring pattern is provided on a substrate, and does not protrude from a surface of the substrate.

27. The circuit component built-in module according to claim 26, wherein the substrate is a circuit board containing an electric insulation material.

28. The circuit component built-in module according to claim 27, wherein the circuit board has a multilayer wiring structure in which a plurality of the first wiring patterns are arranged in a plurality of layers in the electric insulation material.

29. The circuit component built-in module according to claim 22, wherein the conductive material is a conductive resin composition containing a solder, or a combination of a metal powder and a thermosetting resin.

30. The circuit component built-in module according to claim 29, wherein the solder contains, as a principal component thereof, at least one kind of metal selected from the group consisting of Pb, Cu, Zn, Sn, Ag, and In.

31. The circuit component built-in module according to claim 29, wherein the metal powder contains at least one kind of metal selected from the group consisting of Au, Ag, Cu, Ni, Pd, and Pt.

32. The circuit component built-in module according to claim 22, wherein, in the component body, a thickness of the first portion at a position where the first portion is thinnest is not more than 90% of a thickness of the second portion.

33. The circuit component built-in module according to claim 22, wherein a surface of the external electrode of the circuit component that is opposed to the reference plane is tilted at a tilt angle of not less than 10° and not more than 50° with respect to the reference plane.

34. The circuit component built-in module according to claim 22, wherein a distance from the reference plane to a surface of the external electrode of the circuit component that is opposed to the reference plane at a position where the surface and the reference plane are separated farthest is not less than 30 µm and not more than 100 µm.

35. The circuit component built-in module according to claim 22, wherein the external electrode of the circuit component is arranged so as not to cross the reference plane.

36. The circuit component built-in module according to claim 22, wherein the circuit component is a surface-mountable chip component.

37. The circuit component built-in module according to claim 36, wherein the chip component is at lest one selected from the group consisting of a resistor, a capacitor, and an inductor.

38. The circuit component built-in module according to claim 22, wherein the conductive material does not protrude into a region on a mounting member side with respect to the reference plane, the mounting member side being a side on which the mounting member is positioned.

* * * * *

UNITED STATES PATENT AND TRADEMARK OFFICE
CERTIFICATE OF CORRECTION

PATENT NO.    : 6,787,884 B2                                                Page 1 of 1
DATED         : May 29, 2003
INVENTOR(S)   : Hirano et al.

It is certified that error appears in the above-identified patent and that said Letters Patent is hereby corrected as shown below:

Column 32,
Line 27, "form" should be -- from --.

Signed and Sealed this

Eighteenth Day of October, 2005

JON W. DUDAS
*Director of the United States Patent and Trademark Office*